United States Patent
Dwilinski et al.

(10) Patent No.: US 7,905,957 B2
(45) Date of Patent: Mar. 15, 2011

(54) METHOD OF OBTAINING BULK SINGLE CRYSTALS BY SEEDED GROWTH

(75) Inventors: Robert Dwilinski, Warsaw (PL);
Roman Doradzinski, Warsaw (PL);
Jerzy Garczynski, Lomianki (PL);
Leszek Sierzputowski, Union, NJ (US);
Yasuo Kanbara, Anan (JP)

(73) Assignees: Ammono Sp. Z.O.O., Warsaw (PL);
Nichia Corporation, Anan-shi (JP)

( * ) Notice: Subject to any disclaimer, the term of this patent is extended or adjusted under 35 U.S.C. 154(b) by 78 days.

(21) Appl. No.: 11/791,716

(22) PCT Filed: Nov. 28, 2005

(86) PCT No.: PCT/JP2005/022396
§ 371 (c)(1),
(2), (4) Date: May 29, 2007

(87) PCT Pub. No.: WO2006/057463
PCT Pub. Date: Jun. 1, 2006

(65) Prior Publication Data
US 2008/0156254 A1    Jul. 3, 2008

(30) Foreign Application Priority Data

Nov. 26, 2004  (PL) .......................................... 371405

(51) Int. Cl.
*C30B 7/00* (2006.01)
(52) U.S. Cl. ..................... 117/68; 117/2; 117/3; 117/69; 117/70
(58) Field of Classification Search ............ 117/11, 117/35, 36, 902, 907, 2, 3, 68–70, 76, 952; 257/E21.119; 428/337; 438/22
See application file for complete search history.

(56) References Cited

U.S. PATENT DOCUMENTS

| | | | |
|---|---|---|---|
| 5,096,860 | A | 3/1992 | Nadakarni |
| 5,147,623 | A | 9/1992 | Eun et al. |
| 5,190,738 | A | 3/1993 | Parent |
| 5,306,662 | A | 4/1994 | Nakamura et al. |
| 5,456,204 | A | 10/1995 | Dimitrov et al. |

(Continued)

FOREIGN PATENT DOCUMENTS

CN    1036414 A    10/1989

(Continued)

OTHER PUBLICATIONS

Yano, M. et al., "Growth of Nitride Crystals, BN, AlN and GaN by Using a Na Flux", Diamond and Related Materials, Apr. 2000, pp. 512-515, vol. 9, Elsevier Science S.A.

(Continued)

*Primary Examiner* — Robert M Kunemund
(74) *Attorney, Agent, or Firm* — Smith Patent Office

(57) ABSTRACT

The present invention is related to a process for obtaining a larger area substrate of mono-crystalline gallium-containing nitride by making selective crystallization of gallium containing nitride on a smaller seed under a crystallization temperature and/or pressure from a supercritical ammonia-containing solution made by dissolution of gallium-containing feedstock in a supercritical ammonia-containing solvent with alkali metal ions, comprising: providing two or more elementary seeds, and making selective crystallization on the two or more separate elementary seeds to get a merged larger compound seed. The merged larger compound seed is used for a seed in a new growth process and then to get a larger substrate of mono-crystal gallium-containing nitride.

40 Claims, 14 Drawing Sheets

U.S. PATENT DOCUMENTS

| | | |
|---|---|---|
| 5,589,153 A | 12/1996 | Garces et al. |
| 5,637,531 A | 6/1997 | Porowski et al. |
| 5,679,965 A | 10/1997 | Schetzina |
| 5,780,876 A | 7/1998 | Hata |
| 5,868,837 A | 2/1999 | DiSalvo et al. |
| 5,868,873 A | 2/1999 | Brown et al. |
| 5,928,421 A | 7/1999 | Yuri et al. |
| 6,031,858 A | 2/2000 | Hatakoshi et al. |
| 6,046,464 A | 4/2000 | Schetzina |
| 6,051,145 A | 4/2000 | Griffth et al. |
| 6,067,310 A | 5/2000 | Hashimoto et al. |
| 6,139,628 A | 10/2000 | Yuri et al. |
| 6,150,674 A | 11/2000 | Yuri et al. |
| 6,153,010 A | 11/2000 | Kiyoku et al. |
| 6,156,581 A | 12/2000 | Vaudo et al. |
| 6,172,382 B1 | 1/2001 | Nagahama et al. |
| 6,177,057 B1 | 1/2001 | Purdy |
| 6,177,292 B1 | 1/2001 | Hong et al. |
| 6,248,607 B1 | 6/2001 | Tsutsui |
| 6,249,534 B1 | 6/2001 | Itoh et al. |
| 6,252,261 B1 | 6/2001 | Usui et al. |
| 6,258,617 B1 | 7/2001 | Nitta et al. |
| 6,265,322 B1 | 7/2001 | Anselm et al. |
| 6,270,569 B1 | 8/2001 | Shibata et al. |
| 6,303,403 B1 | 10/2001 | Sato et al. |
| 6,329,215 B1 | 12/2001 | Porowski et al. |
| 6,335,546 B1 | 1/2002 | Tsuda et al. |
| 6,355,497 B1 | 3/2002 | Romano et al. |
| 6,372,041 B1 | 4/2002 | Cho et al. |
| 6,380,051 B1 | 4/2002 | Yuasa et al. |
| 6,398,867 B1 | 6/2002 | D'Evelyn et al. |
| 6,399,500 B1 | 6/2002 | Porowski et al. |
| 6,399,966 B1 | 6/2002 | Tsuda et al. |
| 6,407,409 B2 | 6/2002 | Cho et al. |
| 6,423,984 B1 | 7/2002 | Kato et al. |
| 6,447,604 B1 | 9/2002 | Flynn et al. |
| 6,459,712 B2 | 10/2002 | Tanaka et al. |
| 6,468,882 B2 | 10/2002 | Motoki et al. |
| 6,475,277 B1 | 11/2002 | Hirota et al. |
| 6,509,651 B1 | 1/2003 | Matsubara et al. |
| 6,531,072 B1 | 3/2003 | Suda et al. |
| 6,534,795 B2 | 3/2003 | Hori et al. |
| 6,562,466 B2 | 5/2003 | Jiang et al. |
| 6,586,762 B2 | 7/2003 | Kozaki |
| 6,592,663 B1 | 7/2003 | Sarayama et al. |
| 6,593,589 B1 | 7/2003 | Oshinski et al. |
| 6,596,079 B1 | 7/2003 | Vaudo et al. |
| 6,614,824 B2 | 9/2003 | Tsuda et al. |
| 6,627,552 B1 | 9/2003 | Nishio et al. |
| 6,639,925 B2 | 10/2003 | Niwa et al. |
| 6,653,663 B2 | 11/2003 | Ishida |
| 6,656,615 B2 | 12/2003 | Dwilinski et al. |
| 6,657,232 B2 | 12/2003 | Morkoc |
| 6,677,619 B1 | 1/2004 | Nagahama et al. |
| 6,686,608 B1 | 2/2004 | Takahira |
| 6,693,935 B2 | 2/2004 | Tojo et al. |
| 6,711,191 B1 | 3/2004 | Kozaki et al. |
| 6,720,586 B1 | 4/2004 | Kidoguchi et al. |
| 6,749,819 B2 | 6/2004 | Otsuka et al. |
| 6,858,882 B2 | 2/2005 | Tsuda et al. |
| 6,924,512 B2 | 8/2005 | Tsuda et al. |
| 6,951,695 B2 | 10/2005 | Xu et al. |
| 7,053,413 B2 | 5/2006 | D'Evelyn et al. |
| 7,057,211 B2 | 6/2006 | Dwilinski et al. |
| 7,081,162 B2 | 7/2006 | Dwillinski et al. |
| 7,097,707 B2 | 8/2006 | Xu |
| 7,099,073 B2 | 8/2006 | Chowdhury et al. |
| 7,132,730 B2 | 11/2006 | Dwilinski et al. |
| 7,160,388 B2 | 1/2007 | Dwilinski et al. |
| 7,252,712 B2 | 8/2007 | Dwilinski et al. |
| 7,291,544 B2 | 11/2007 | D'Evelyn et al. |
| 7,314,517 B2 | 1/2008 | Dwilinski et al. |
| 7,315,599 B1 | 1/2008 | Morriss |
| 7,335,262 B2 | 2/2008 | Dwilinski et al. |
| 7,364,619 B2 | 4/2008 | Dwilinski et al. |
| 7,374,615 B2 | 5/2008 | Dwilinski et al. |
| 7,387,677 B2 * | 6/2008 | Dwilinski et al. ............ 117/73 |
| 7,410,539 B2 * | 8/2008 | Dwilinski et al. ............ 117/71 |
| 7,420,261 B2 | 9/2008 | Dwilinski et al. |
| 7,422,633 B2 * | 9/2008 | Dwilinski et al. ............ 117/68 |
| 2001/0008656 A1 | 7/2001 | Tischler et al. |
| 2001/0015437 A1 | 8/2001 | Ishii et al. |
| 2001/0022154 A1 | 9/2001 | Cho et al. |
| 2001/0030328 A1 | 10/2001 | Ishida |
| 2002/0011599 A1 | 1/2002 | Motoki et al. |
| 2002/0014631 A1 | 2/2002 | Iwata et al. |
| 2002/0028564 A1 | 3/2002 | Motoki et al. |
| 2002/0031153 A1 | 3/2002 | Niwa et al. |
| 2002/0047113 A1 | 4/2002 | Ohno et al. |
| 2002/0063258 A1 | 5/2002 | Motoki |
| 2002/0078881 A1 | 6/2002 | Cuomo et al. |
| 2002/0096674 A1 | 7/2002 | Cho et al. |
| 2002/0189531 A1 | 12/2002 | Dwilinski et al. |
| 2002/0192507 A1 | 12/2002 | Dwilinski et al. |
| 2003/0001238 A1 | 1/2003 | Ban |
| 2003/0003770 A1 | 1/2003 | Morita et al. |
| 2003/0022028 A1 | 1/2003 | Koike et al. |
| 2003/0143771 A1 | 7/2003 | Kidoguchi et al. |
| 2003/0164138 A1 | 9/2003 | Sarayama et al. |
| 2003/0209191 A1 | 11/2003 | Purdy |
| 2004/0003495 A1 | 1/2004 | Xu |
| 2004/0031978 A1 | 2/2004 | D'Evelyn et al. |
| 2004/0089221 A1 | 5/2004 | Dwilinski et al. |
| 2004/0139912 A1 | 7/2004 | Dwilinski et al. |
| 2004/0238810 A1 | 12/2004 | Dwilinski et al. |
| 2004/0244680 A1 | 12/2004 | Dwilinski et al. |
| 2004/0251471 A1 | 12/2004 | Dwilinski et al. |
| 2004/0255840 A1 * | 12/2004 | Dwilinski et al. ............ 117/2 |
| 2004/0261692 A1 | 12/2004 | Dwilinski et al. |
| 2005/0087124 A1 | 4/2005 | Dwilinski et al. |
| 2005/0249255 A1 | 11/2005 | Dwilinski et al. |
| 2006/0032428 A1 | 2/2006 | Dwilinski et al. |
| 2006/0037530 A1 * | 2/2006 | Dwilinski et al. ............ 117/70 |
| 2006/0054075 A1 | 3/2006 | Dwilinski et al. |
| 2006/0054076 A1 | 3/2006 | Dwilinski et al. |
| 2006/0057749 A1 | 3/2006 | Dwilinski et al. |
| 2006/0120931 A1 | 6/2006 | Dwilinski et al. |
| 2006/0124051 A1 | 6/2006 | Yoshioka et al. |
| 2006/0138431 A1 | 6/2006 | Dwilinski et al. |
| 2006/0177362 A1 | 8/2006 | D'Evelyn et al. |
| 2006/0191472 A1 | 8/2006 | Dwilinski et al. |
| 2007/0234946 A1 | 10/2007 | Hashimoto et al. |
| 2008/0050855 A1 | 2/2008 | Dwilinski et al. |
| 2008/0067523 A1 | 3/2008 | Dwilinski et al. |
| 2008/0102016 A1 | 5/2008 | Hashimoto |
| 2008/0108162 A1 | 5/2008 | Dwilinski et al. |
| 2008/0156254 A1 | 7/2008 | Dwilinski et al. |
| 2008/0303032 A1 | 12/2008 | Dwilinski et al. |
| 2009/0072352 A1 | 3/2009 | Hashimoto et al. |

FOREIGN PATENT DOCUMENTS

| | | |
|---|---|---|
| CN | 1289867 A | 4/2001 |
| CN | 1065289 B | 5/2001 |
| CN | 1260409 C | 6/2006 |
| EP | 0716457 A | 6/1996 |
| EP | 0711853 B | 9/1999 |
| EP | 0949731 A | 10/1999 |
| EP | 0973207 A | 1/2000 |
| EP | 1088914 A | 4/2001 |
| EP | 1164210 A | 12/2001 |
| EP | 1405936 A | 4/2004 |
| EP | 1514958 A1 | 3/2005 |
| EP | 1 616 981 A | 1/2006 |
| EP | 1770189 A2 | 4/2007 |
| FR | 2796657 A | 1/2001 |
| GB | 2326160 A | 12/1998 |
| GB | 2333521 A | 7/1999 |
| JP | 51-41686 A | 4/1976 |
| JP | 60065798 A | 4/1985 |
| JP | 2-137287 A | 5/1990 |
| JP | 5-183189 A | 7/1993 |
| JP | 7-22692 B | 3/1995 |
| JP | 7-165498 A | 6/1995 |
| JP | 7-249830 A | 9/1995 |
| JP | 8-250802 A | 9/1996 |
| JP | 9-134878 A | 5/1997 |
| JP | 9-508093 A | 8/1997 |

| | | |
|---|---|---|
| JP | 9-293897 A | 11/1997 |
| JP | 9-512385 A | 12/1997 |
| JP | 10-7496 A | 1/1998 |
| JP | 10-70079 A | 3/1998 |
| JP | 10-70338 A | 3/1998 |
| JP | 11-54847 A | 2/1999 |
| JP | 11-189498 A | 7/1999 |
| JP | 11-224856 A | 8/1999 |
| JP | 11-307813 A | 11/1999 |
| JP | 11-340573 A | 12/1999 |
| JP | 2000-44400 A | 2/2000 |
| JP | 2000-82863 A | 3/2000 |
| JP | 2000-82867 A | 3/2000 |
| JP | 2000-216494 A | 8/2000 |
| JP | 2000-327495 A | 11/2000 |
| JP | 2001-342100 A | 12/2000 |
| JP | 2001-077038 A | 3/2001 |
| JP | 2001-148510 A | 5/2001 |
| JP | 2001-185718 A | 7/2001 |
| JP | 2001-210861 A | 8/2001 |
| JP | 2001-247399 A | 9/2001 |
| JP | 2002-9392 A | 1/2002 |
| JP | 2002-26442 A | 1/2002 |
| JP | 2002-29897 A | 1/2002 |
| JP | 2002-53399 A | 2/2002 |
| JP | 2002-68897 A | 3/2002 |
| JP | 2002-134416 A | 5/2002 |
| JP | 2002-241112 A | 8/2002 |
| JP | 2002-274997 A | 9/2002 |
| JP | 2003-527296 A | 9/2003 |
| PL | 347918 A | 12/2002 |
| PL | 350375 A | 5/2003 |
| WO | 94/28204 A | 12/1994 |
| WO | 9504845 A | 2/1995 |
| WO | 97/13891 A | 4/1997 |
| WO | 98/47170 A1 | 10/1998 |
| WO | 98/55671 A | 12/1998 |
| WO | 01/24284 A | 4/2001 |
| WO | 01/24921 A | 4/2001 |
| WO | 01/68955 A | 9/2001 |
| WO | 02/101124 A | 12/2002 |
| WO | WO 02/101120 A | 12/2002 |
| WO | 03/043150 A1 | 5/2003 |
| WO | WO 03/035945 A | 5/2003 |
| WO | 2004/090202 A | 10/2004 |

OTHER PUBLICATIONS

Beaumont, B. et al. "Epitaxial Lateral Overgrowth of GaN", Physica Status Solidi. (b), Sep. 2001 pp. 1-43, vol. 227, No. 1. Wiley-YCH Verlag Berlin GmbH, Berlin.
D. R. Ketchum et al., Crystal growth of gallium nitride in supercritical ammonia, Journal of Crystal Growth, 2001, p. 431-434, vol. 222, No. 3, Elsevier Science B.V.
R. Dwilinski et al., Exciton photo-luminescence of GaN bulk crystals grown by the AMMONO method, Material Science and Engineering B, 1997, p. 46-49, vol. 50, No. 1-3, Elsevier Science S.A.
R. Dwilinski et al., AMMONO method of GaN and AlN production, Diamond and Related Materials, 1998, p. 1348-1350, vol. 7, Elsevier Science S.A.
R. Dwilinski et al., On GaN Crystallization by Ammonothermal Method, Acta Physica Polonica A,1996, p. 763-766, vol. 90.
K. Pakula, et al., Growth of GaN Metalorganic Chemical Vapour Deposition Layerts on GaN Sigle Crystals, Acta Physica Polonica A, 1995, p. 861-864, vol. 88, No. 5.
R. Dwilinski et al., AMMONO method of BN, AlN and GaN synthesis and crystal growth, MRS Internet Journal Nitride Semiconductor Research, 1998, vol. 3, No. 25, MRS Internet Journal Nitride Semiconductor Res.
Yano et al., Control of Nucleation Site and Growth Orientation of Bulk GaN Crystals, Japanese Journal of Applied Physics, Oct. 1999, p. L1121-L1123, vol. 38, No. 10A, Part 2.
Aoki et al., Growth of GaN single crystal from a Na-Ga melt at 750° C and 5MPa of N2, Journal of Crystal Growth, 2000, p. 7-12, vol. 218, No. 1, Elsevier Science B.V.
Yamane et al., Polarity of GaN Single Crystals Prepared with Na Flux, Japanese Journal of Applied Physics, 1998, vol. 37, No. 6A, Part 1, Japanese Journal of Applied Physics.

Kuramata et al., Substrates for III-V nitride semiconductors, Oyobutsuri, 1996, p. 936-940, vol. 65, No. 9.
I. Grzegory, High pressure growth of bulk GaN from solutions in gallium, Journal of Physics Condensed Matter, 2001, p. 6875-6892, v. 13, No. 32, IOP Publishing Ltd.
O. Oda et al., GaN Bulk Substrates for GaN Based LEDs and LDs, Phys. Stat. Sol.(a), 2000, p. 51-58, v. 180, No. 51, IOP Publishing Ltd.
Yu Melnik et al. Properties of Free Standing GAN Bulk Crystals Grown by HVPE, Mat. Res. Soc. Symp. Proc. 1998, p. 269-274, vol. 482, Materials Research Society.
C.M. Balkas et al., Growth of Bulk AlN and GaN Single Crystals by Sublimation, Mat. Res. Soc. Symp. Proc., 1997, p. 41-46, vol. 449, Materials Research Society.
S. Porowski et al., Bulk and homepitaxial GaN-growth and characterisation, Journal of Crystal Growth, 1998, p. 153-158, 189/ 190, Elsevier Science B.V.
P. Waltereit et al., Nitride semiconductors free of electrostatic fields for efficient white light-emitting diodes, Nature, Aug. 24, 2000, p. 865-868, vol. 406.
O. Btandt et al., Critical issues for the growth of high-quality (Al, Ga)N/GaN and GaN/(In, Ga)N heterostructures on SiC (001) by molecular-beam epitaxy, Applied Physics Letters, Dec. 20, 1999, p. 4019-4021, vol. 75, No. 25, American Institute of Physics.
M. Fukuda, Optical Semiconductor Devices, Wiley Series in Microwave and Optical Engineering, 1998, p. 7, John Wiley & Sons Inc., New York.
S. M. Sze, Modern Semiconductor Device Physics, 1998, p. 539-540, 4, John Wiley & Sons Inc., New York.
S. Porowski, High pressure growth of GaN—new prospects for blue lasers, Journal of Crystal Growth,1996, p. 583-589, vol. 166, Elsevier Science B.V.
A. P. Purdy, Ammonothermal Synthesis of Cubic Gallium Nitride, Chem. Mater., Jul. 1, 1999, p. 1648-1651, vol. 11, the American Chemical Society.
Y. C. Lan et al., Syntheses and structure of nanocrystalline gallium nitride obtained from ammonothermal method using lithium metal as mineralizator, Materials Research Bulletin, 2000, p. 2325-2330, vol. 35, Elsevier Science Ltd.
Hydrothermal synthesis of crystals in chloride systems, Izd. Nauka, 1975, p. 124-125 and 133-134, Moscow.
T. Penkala, Zarys Krystalografii (Basic of Crystallography), PWN, 1972, p. 349, Warszawa.
E. K. Sangwal, Elementary Crystal Growth, 1994, p. 331, Lublin.
Y. Song et al, Bulk GaN single crystals: growth conditions by flux method, Journal of Crystal Growth, 2003, p. 275-278, vol. 247, Elsevier Siene B.V.
M. Palczewska et al, Paramagnetic defects in GaN, MRS Internet Journal Nitride Semiconductor Research, 1998, vol. 3, No. 45, MRS Internet J. Nitride Semicond. Res.
X. Mao et al., New Concept Technology Pressure-Variation Liquid Phase Epitaxy, SPIE Photonics Taiwan Conference Proceedings, Jul. 2000, p. 1-12.
S. Hirano et al, Hydrothermal Synthesis of Gallium Orthophosphate Crystals, Bull. Chem. Soc. Jpn., 1989, p. 275-278, 62, The Chemical Society of Japan.
Single Crystal Growth, Hydrothermal Synthesis Handbook, 1997, p. 245-255, chapter 1.
R. A. Laudise, What is Materials Chemistry?, Materials for nonlinear optics: Chemical Perspectives, p. 410-433, Chapter 27,American Chemical Society.
N. Sakagami et al., Growth Kinetics and Morphology of ZnO Single Crystal Grown under Hydrothermal Conditions, Journal of the Ceramic Association, 1974, p. 405-413, vol. 82.
T. Sekiguchi et al., Hydrothermal growth of ZnO single crystals and their optical characterization, Journal of Crystal Growth, 2000, p. 72-76, vol. 214/215, Elsevier Science B.V.
K. Yanagisawa et al., Hydrothermal single crystal growth of calcite in ammonium acetate solution, Journal of Crystal Growth, 1996, p. 285-294, vol. 163, Elsevier Science B.V.
K. Yanagisawa et al., Improvement of quality of hydrothermally grown calcite single crystals, Journal of Crystal Growth, 2001, p. 440-444, vol. 229, Elsevier Science B.V.

S. Hirano et al., Growth of gallium orthophosphate single crystals in acidic hydrothermal solutions, Journal of Material Science, 1991, p. 2805-2808, vol. 26, Chapman and Hall Ltd.

S. T. Kim et al., Preparation and propertoes of free-standing HVPE grown GaN substrates, Journal of Crystal Growth, 1998, p. 37-42,194, Elsevier Science B.V.

N. Kuroda, Precise control of pn-junction profits for GaN-based LD structures using GaN substrates with low dislocation densities,Journal of Crystal Growth, 1998, p. 551-555, vol. 189/190, Elsevier Science B.V.

A. Kaschner, Influence of Doping on the Lattice Dynamics of Gallium Nitride, MRS Internet Journal Nitride Semiconductor Research, 1999, 4S1, G3, 57.

K. Motoki, Preparation of Large Freestanding GaN Substrates by Hydride Vapor Phase Epitaxy Using GaAs as a Starting Substrate, Jpn. J. Appl. Phys. Feb. 15, 2001, pp. L140-L143, vol. 40 Part 2, No. 2B, The Japan Society of Applied Physics.

T. L. Chu et al., Crystal Growth and Characterization of Gallium Nitride, J. Electrochem. Soc.: Solid-State Science and Technology, Jan. 1994, vol. 121, No. 1, p. 159-162.

I. Akasaki et al, Growth and Propertoes of Single Crystalline GaN Films by Hydride Vapor Phase Epitaxy , Crystal Properties and Preparation, 1991, p. 154-157, vol. 32-24, Trans Tech Publications, Switzerland.

H.Yamane, Na Flux Growth of GaN Single Crystals, Journal of the Japanese Association for Crystal Growth, 1998, p. 14-18, vol. 25, No. 4.

H. Yamane, Morphology and characterization of GaN single crystals grown in a Na flux, Journal of Crystal Growth, 1998, p. 8-12, vol. 186, Elsevie Science B.V.

L. Liu et al, Substrates for gallium nitride epitaxy, Material Science and Engineering R, Reports: A Review Journal, 2002, p. 61-127, vol. 37, Elsevier Science B.V.

M. K. Kelly et al., Optical patterning of GaN films, Applied Physics Letters, Sep. 16, 1996, p. 1749-1751, vol. 69, No. 12, American Institute of Physics.

W. S. Wong et al., Fabrication of thin film InGaN light emitting diode membranes by laser lift-off, Applied Physics Letters, Sep. 6, 1999, p. 1360-1362, vol. 75, No. 10, American Institute of Physics.

S. Porowski et al., Prospects for high-pressure crystal growth of III-V nitrides, Inst. Phys. Conf. the 5th SiC and Related Materials Conf., 1993, 369-372, Series No. 137, chapter 4.

D. Peters, Ammonothermal Systhesis of Aluminum Nitride, Journal of Crystal Growth, 1990, p. 411-418, vol. 104, Elsevier Secience Publishers B.V., North-Holland.

T. Inoue et al, Growth of bulk GaN single crystals by the pressure-controlled solution growth method, Journal of Crystal Growth, 2001, p. 35-40, vol. 229, Elsevier Science B.V.

J.W. Kolis et al., Materials Chemistry and Bulk Crystal Growth of GRPUP III Nitrides in Supercritical Ammonia, Mat. Res. Soc. Symp. Proc., 1998, p. 367-372, vol. 495, Materials Research Society.

Communication pursuant to Article 94(3)EPC of the corresponding European Patent Application No. 03778841.1.

Communication pursuant to Article 94(3)EPC of the corresponding European Patent Application No. 03733682.3.

Notification of Reason(s) for Refusal, directed to Japanese Patent Application No. 2003-538438, issued on Jul. 28, 2009; 3 pages.

Canadian Office Action, mailed Apr. 2, 2009, directed to Canadian Patent Application No. 2,449,714; 4pages.

U.S. Office Action, mailed Apr. 28, 2009, directed to U.S. Appl. No. 11/969,735; 26 pages.

Japanese Notification of Reason(s) for Refusal, mailed May 12, 2009, directed to Japanese Patent Application No. 2003-544869; 6 pages.

Japanese Notification of Reason(s) for Refusal, mailed May 7, 2009, directed to Japanese Patent Application No. 2004-506141; 6 pages.

Kato et a.l, "MOVPE Growth of GaN on Off-Angle Sapphire Substrate," IEICE Technical Report ED88-22~33, pp. 43-48, May 28, 1988, vol. 88 No. 61, The Institute of Electronics, Information and Communication Engineers of Japan, Kikai-Shinko-Kaikan Bldg., 5-8 Shbakoen 3 chome, Miatok-ku Tokyo 105 Japan.

Sakai et al., "Defect Structure in Selectively Grown GaN Films With Low Threading Dislocation Density," Applied Physics Letter., Oct. 20, 1997, pp. 2259-2261, vol. 71 No. 16, American Institute of Physics.

Chinese Office Action, mailed Jun. 5, 2009, directed to Chinese Patent Application No. 200580040008.X; 13 pages.

Communication pursuant to Article 94(3)EPC directed to European Patent Application No. 02 762 734.8, dated Oct. 21, 2009; 4 pages.

Notification of Reason(s) for Refusal directed to Japanese Patent Application No. 2004-506101, dated Nov. 4, 2009; 4 pages.

Q. -S. Chen et al., Modeling of ammonothermal growth of nitrides, Journal of Crystal Growth 258, 2003, p. 181-187, Elsevier Science B.V.

Q. -S. Chen et al., Effects of baffle design on fluid flow and heat transfer in ammonothermal growth of nitrides, Journal of Crystal Growth 266, 2004, p. 271-277, Elsevier Science B.V.

A. Yoshikawa et al., Crystal growth of GaN by ammonothermal method, Journal of Crystal Growth 260, 2004, p. 67-72, Elsevier Science B.V.

T. Hashimoto et al., Growth of gallium nitride via fluid transport in supercritical ammonia, Journal of Crystal Growth 275, 2005, e525-e530, Elsevier Science B.V.

B. Raghothamachar et al., Characterization of bulk grown GaN and AlN single crystal materials, Journal of Crystal Growth 287, 2006, p. 349-353, Elsevier Science B.V.

J. -K. Ho et al., Low-resistance ohmic contacts to p-type GaN achieved by the oxidation of Ni/Au films, Journal of Applied Physics, vol. 86, No. 8, Oct. 15, 1999, pp. 4491-pp. 4497, American Institute of Physics.

Non-final office action directed to U.S. Appl. No. 12/109,075, issued on Apr. 12, 2010, 38 pages.

Non-final office action directed to U.S. Appl. No. 12/213,212, issued on Jul. 30, 2010, 15 pages.

Non-final office action directed to U.S. Appl. No. 11/629,109, issued on Aug. 6, 2010, 9 pages.

\* cited by examiner

ND OF OBTAINING BULK SINGLE CRYSTALS BY SEEDED GROWTH

METHOD OF OBTAINING BULK SINGLE CRYSTALS BY SEEDED GROWTH

The invention relates to a method of obtaining a larger bulk mono-crystalline by seeded growth on one slender seed or two or more slender seeds.

PRIOR ART

Nitrides of Group XIII elements (IUPAC, 1989), including the gallium-containing nitride are a valuable material for the optoelectronic industry.

The bulk mono-crystalline GaN is considered as the perfect substrate for deposition of epitaxial layers of GaN, whose energy gap can be used for creation of laser diodes (LD) and light emitting diodes (LED), which emit blue light. The condition for using as a substrate for epitaxy is a good crystalline quality and low surface dislocation density of the single crystal.

The demand of the industry for mono-crystalline gallium-containing nitride of appropriate technological parameters remains unfulfilled, in spite of notices indicating that research conducted in many industrial and scientific centres around the world every year brings the manufacturers closer to obtaining the material of the appropriate quality.

In the publication WO 02/101120 the method of obtaining bulk gallium-containing nitride in the method of crystallization on the seed, from the super-critical nitrogen-containing solvent, preferably ammonia-containing solvent, was disclosed. The method allows for obtaining of bulk gallium-containing nitrides with quality parameters higher than the parameters of substrates used by the industry, obtained by the methods of deposition of gaseous phase, such as HVPE and MOCVD or MBE, that is of lower surface dislocation density than these substrates. Single crystals obtained by the method known from WO 02/101120 show great increase in volume. Due to the equilibrium character of the crystallization process from the nitrogen-containing solution, one can obtain a very high crystalline quality of the thus produced single crystals, in comparison to materials used in the industry in many centres around the world. The main advantage of the technology known from WO 02/101120, are preferable ranges of pressure and temperature, in which the process of re-crystallization of gallium-containing nitride from a supercritical solution based on a nitrogen-containing solvent is carried out.

Other methods of gallium-containing nitride synthesis are also known, such as HNP, during which one can obtain gallium nitride single crystals of very high crystalline quality and lower surface dislocation density. Unfortunately, unsatisfactory sizes and irregular shape of the obtained crystals disqualifies them, so far, as a material for the substrates for epitaxy suitable for the industrial production of LED, LD and other semi-conductor structures. Also the growth parameters, and particularly the necessity of using very high pressure, limit the possibility of obtaining crystals of the required sizes by this method on the industry scale.

There are, however, in literature on the subject, notes on promising results obtained with the use of flux methods of gallium-containing nitride growth from the melt of gallium in the nitride atmosphere. Industrial attractiveness of the processes derives from the use of relatively low temperatures and low pressures.

In the process of further research and development works on the method disclosed in WO 02/101120, many factors influencing the limitation of the practical use of this method was identified. Technological barriers in the research are being gradually conquered.

One of the research directions is to provide seeds for the production of gallium containing single crystals. The aim of the research is to obtain seeds of satisfactory quality parameters and of bigger size.

During the conducted research, it has been stated, that the seeds used so far, obtained by the HVPE method, in which the mono-crystalline layers of gallium-containing nitride are deposited from the gaseous phase on hetero-substrates, in particular on sapphire, do not provide homogeneous growth conditions of the single crystal deposited thereon. As a result of differences between the crystalline lattice constants of the hetero-substrate and the obtained mono-crystalline layer of gallium-containing nitride, as well as due to the result of differences in the thermal expansion coefficients of both materials, gallium-containing nitride, preferably gallium nitride, obtained through the HVPE method, has a disrupted crystal structure, resulting in, among others, a small radius of curvature of crystalline lattice of the obtained layers of gallium-containing nitride. The use of the single crystals as seeds in the process of re-crystallization of gallium-containing nitride from the supercritical ammonia-containing solution caused propagation of crystal defects, and the surface dislocations in the bulk gallium-containing nitride layers, deposited on said seeds, grown in the same direction as the direction of the growth of the seed.

The publication WO 03/035945 indicated the advantages resulting from covering of the seeds with the ELOG structures having surfaces susceptible to lateral growth, that is, in the direction of the axis perpendicular to the direction of growth of the seed. Due to the random distribution of the crystal defects and surface dislocations, the seeds covered with ELOG structures cannot eliminate in a satisfactory degree the propagation of crystal defects from the primary substrate created by the HVPE method to the mono-crystalline layers of gallium-containing nitride deposited from the supercritical solution based on a nitrogen-containing solvent. The surfaces susceptible to lateral growth, placed in close vicinities from one another, are separated by strips grown directly on the primary substrate. One needs to notice, that the multiple and alternate deposition of ELOG structures on the seeds cannot be taken into consideration due to the costs, but independently from costs, the surface dislocation density of the crystals obtained on the ELOG structures is at least approximately $10^6/cm^2$.

THE PROBLEMS TO BE SOLVED

In the techniques of obtaining crystals, there are some directions of the crystalline lattice, where the crystals grow faster, but other directions where the crystals grow slower. Consequently, there are our called slow-growing and fast-growing directions (and faces). The directions depend on the crystals, and the selected method of their growth. They can be defined on the basis of an analysis of the structure of the crystal obtained spontaneously.

In the so far processes of obtaining the bulk single crystals by the method of growth of the seed, the phenomenon of the disappearance of fast-growing faces was a crucial factor limiting the possibility of obtaining big size single crystals. That phenomenon can also limit the possibility of obtaining single crystals of big sizes in the processes conducted according to the HNP method. In a long-term crystallization process according to prior art, it was only possible to use the growth of slow-growing faces, which had negative influence on the economy of the processes.

THE OBJECTIVE OF THE PRESENT INVENTION

In a typical case of obtaining the bulk nitride single crystals by seeded growth, it has been found according to our inventive researches, that in the process of crystal growth of gallium containing nitride, the fast-growing faces, which are A-faces, reduce their surface area (due to the fast growth of a crystal in that direction), until the final disappearance, when the crystal limited by the slow-growing faces, which are M-faces, is formed. In that way, the fast growth of a crystal, connected with the change of its shape, is finished. In the further process of growth the crystal retains its shape and it is a slow process. Thus, the fast growth, favorable for the process, is limited in time, and additionally, the differences of crystal growth rate in different directions impose limitations as far as the shape and size of the obtained crystals are concerned.

Therefore, a first object of this invention, is to provide a method of obtaining the bulk single crystals by seeded growth, allowing for defeating the size and shape limitations of the obtained crystals, resulting from the appearance of the slow- and fast-growing directions, and consequently for obtaining single crystals of big sizes, especially of those substances, for which it is not possible to obtain satisfactory large seeds through currently known methods.

A second object of the invention is to provide a method of obtaining bulk single crystals of gallium-containing nitride, by seeded growth, allowing for obtaining single crystals of big sizes and, at the same time, of a reduced surface dislocation density in comparison to the seed.

It is also the object of the invention to provide seeds to be used in a method of obtaining bulk single crystals by seeded growth, allowing for obtaining single crystals of big sizes.

THE SUMMARY OF THE INVENTION

According to one aspect of the present invention, there can be provided a process for obtaining a larger area substrate of mono-crystalline gallium-containing nitride by making selective crystallization of gallium containing nitride on a smaller seed under a crystallization temperature and/or pressure from a supercritical ammonia-containing solution made by dissolution of gallium-containing feedstock in a supercritical ammonia-containing solvent with alkali metal ions, comprising:

providing two or more elementary seeds, and making selective crystallization on the two or more separate elementary seeds to get a merged larger compound seed.

In the present process, according to another aspect of the present invention, the merged larger compound seed is used for a seed in a new growth process and then to get a larger substrate of mono-crystal gallium-containing nitride.

More generally, according to the present invention, in the process for obtaining single crystals by seeded growth two or more elementary seeds are used, and at least two of them are merged by straight or lateral growth at the initial stage of the process, thus forming a (larger) compound seed, on which the growth of a single crystal is carried on.

Preferably in this process said elementary seeds have fast-growing growing faces and have merging faces significantly tilted off the slow-growing crystalline plane.

In a preferred variant of the inventive process, at the initial stage of the process (i.e. at the merging stage) straight growth is limited and merging by lateral growth is evoked.

According to the inventive method, after said compound seed is formed—lateral growth can be carried on the thus obtained compound seed.

Alternatively, in the inventive process, after said compound seed is formed—straight growth can be carried on the thus obtained compound seed.

Moreover, the present invention allows that after said compound seed is formed—free growth can be carried on the thus obtained compound seed.

Preferably the elementary seeds are arranged in such a way that their growing faces partially overlap and the surface of join is located between the overlapping parts of the growing faces.

In the process according to the present invention the elementary seeds are preferably placed in a holder, which ensures their precise arrangement with respect to each other.

Moreover, the holder may ensure the desired orientation of their merging faces with respect to each other.

In a particularly preferred embodiment of the present invention the elementary seeds are placed in a holder, which enables covering and/or exposing selected faces of the seed, so that crystalline growth on these faces is essentially disabled/enabled.

The invention covers also the holders used in the inventive process.

Preferably, in the process according to the invention, gallium-containing nitride single crystals, preferably gallium nitride single crystals, are obtained.

According to the invention, said single crystals can be grown by crystallization from supercritical ammonia-containing solution.

Alternatively said single crystals can be grown by crystallization from melt (FLUX method).

If gallium-containing nitride single crystals are obtained by the inventive method, then the elementary seeds grown in the direction parallel to c crystalline axis may be used.

Alternatively the elementary seeds grown in the direction perpendicular to the c crystalline axis and having fast-growing growing faces may be used.

These elementary seeds may have fast-growing growing faces and may be arranged in such a way that the angle between their growing faces is equal to 180°, while the angle between the surface of join and at least one of the growing faces ranges from 30° to 90° and preferably is equal to 45° or 60°.

Preferably, the elementary seeds are polyhedrons with appropriately formed growing and/or merging faces.

Preferably, the elementary seeds have the form of flat plates (wafers) and they lie in one plane.

The growing and/or merging faces of the elementary seeds can be polished.

According to the invention, it is also allowable that the elementary seeds have slow-growing growing faces and are arranged in such a way that the angle between their growing faces is equal to 120°, while the angle between the surface of join and at least one of the growing faces ranges from 0° to 60° and preferably is equal to 15°, 30° or 45°.

Preferably, the elementary seeds are polyhedrons with appropriately formed growing and/or merging faces.

Preferably, the elementary seeds have the form of flat plates (wafers) and they lie in one plane.

The growing and/or merging faces of said elementary seeds may be polished.

The invention covers also the single crystal obtained by the inventive process.

Preferably, a single crystal obtained by the inventive process has its longest dimension of at least 2.5 cm (1 inch), preferably at least 5 cm (2 inches), most preferably at least 10 cm (4 inches).

Still preferably, the same single crystal additionally has the linear dimension of at least 2.5 cm (1 inch), preferably at least 5 cm (2 inches), most preferably at least 10 cm (4 inches), along at least one direction perpendicular to the direction its longest dimension mentioned above.

Preferably, a single crystal obtained by the inventive process has FWHM value of X-ray rocking curve from (0002) plane is below 60 arcsec, preferably about 20 arcsec (for Cu K α1 line).

Preferably, a single crystal obtained by the inventive process has a large radius of curvature of the crystalline lattice, preferably larger than 15 m, more preferably larger than 30 m, most preferably about 70 m.

Preferably, a single crystal obtained by the inventive process has surface dislocation density is lower than $10^4/cm^2$, preferably not higher than $10^2/cm^2$.

In the most preferred case, a single crystal obtained by the inventive process has at the same time all preferred parameters just mentioned, i.e. the size, FWHM value, radius of curvature of the crystalline lattice and surface dislocation density.

Single crystal obtained by the inventive process may be doped with donor-type and/or acceptor-type, and/or magnetic-type dopants, at the concentration from $10^{17}/cm^3$ to $10^{21}/cm^3$, and comprise n-type, p-type or compensated (semi-insulating) material.

The invention relates also to a polar or non-polar wafer, cut out or formed of a single crystal obtained by the inventive process.

The area of the wafer preferably does not contain the surface of join.

Moreover, the invention covers the process for cutting such wafer out of a single crystal, wherein said wafer preferably does not contain the surface of join.

The invention relates also to the use of said single crystal or said wafer, as a whole or in part, as a seed for lateral growth, straight growth or free growth.

According to the invention, said single crystal or said wafer, as a whole or in part, may be used as a substrate for epitaxy.

The invention covers as well a polar or non-polar substrate, cut out or formed of said single crystal.

Preferably, the area of the substrate does not contain the surface of join.

The invention is also related to semiconductor structures deposited on the substrate.

In a method of obtaining bulk single crystals through growth on the seed, according to the invention, one can obtain a bulk single crystal of a size bigger than possible to obtain on each elementary seed separately.

According to the invention, the holder for seeds allows for stabilization of the orientations of the neighboring seeds with respect to each other and, at the same time, provides access of the environment, from which the growth on the seed proceeds, to the growing faces and merging faces of the seeds, as well as enables straight, lateral or free growth on the seed. In the case of gallium nitride, the above mentioned environment is preferably a supercritical ammonia-containing solution which contains soluble forms of gallium.

Moreover, the improvement of crystalline quality can be achieved by suppressing/disabling the crystal growth on selected surfaces of the seed. The growth can be suppressed for example by using appropriate seed holders. Cross-sections of such holders are schematically presented in FIGS. 2 and 7. If the seed (72) was obtained in such a way that during the process of its formation the defects were propagating essentially along the lines perpendicular to the top and bottom surface of the seed, then the crystal growth on these surfaces of the seed should be disabled by covering them with the holder (71) [here "top" and "bottom" refer to the position and orientation of the seed in FIGS. 2 and 7]. However, the crystal growth is possible on the side surface of the seed, which is essentially free of defects. Such crystal grows through the gap (73), in the direction essentially perpendicular to that in which the seed was grown. Owing to such change of direction of crystal growth and disabling growth on the highly defected surfaces of the seed, the obtained crystal has the surface dislocation density remarkably reduced with respect to the surface dislocation density of the seed. Moreover, such crystal has exceptionally favorable parameters of the crystalline lattice (FWHM value of X-ray rocking curve from (0002) plane is below 60 arcsec, preferably about 20 arcsec (for Cu K α1 line); large radius of curvature of the crystalline lattice, preferably larger than 15 m, more preferably larger than 30 m, most preferably about 70 m).

Thanks to the use of seeds of appropriate shape and in the appropriate spatial configuration, it is possible to realize—according to the invention—the basic aim, i.e. obtaining single crystals of big sizes.

The invention allows for obtaining single crystals of sizes a few times bigger than the seeds used, and the use of the appropriate growth directions in conjunction with a defined method of cutting of the obtained crystals allows obtaining crystals and/or wafers of very high quality.

It has turned out, that when the consistent spatial orientation of the crystalline lattices of the seeds is provided, it is possible to obtain compound seeds of required linear sizes, and obtaining a well developed surface of join of neighboring elementary seeds, and, at the same time, as a result of proper selection of directions of growth on the seeds, with the use of the fast growing faces of the compound seed, it became possible to obtain wafers and substrates for epitaxy of the sizes and quality parameters fulfilling the standards required by the optoelectronic industry as shown in FIGS. 24 (a) and (b). If the wafer grows on the compound seed having 3 inches or more in length, we can get as the result a larger growth of the crystal and obtain a lot of 1- or 2-inch substrates from the resulting wafer. Further, when the resulting crystal achieves a thickness of 500 micron, we can make plenty of substrates in one process of growth.

The use of holders for orientation of elementary seeds with respect to each other allows for selective conducting of monocrystalline growth in directions minimizing the propagation of crystal defects from the elementary seeds.

Gallium-containing nitride single crystals, according to the invention, are of unusual sizes, regular shapes and, at the same time, have perfect crystalline quality, adjusted to the technological requirements of the optoelectronic industry.

In a particularly preferable embodiment of the invention, gallium-containing nitride single crystals additionally have the assumed parameters of electrical conductivity. This quality of the substrate for epitaxy made from the inventive single crystals of gallium-containing nitride, will allow to change of the laser structures and shall increase the number of such structures possible to obtain per unit area of substrate for epitaxy.

It also needs to be mentioned that as far as the costs are concerned, the solution according to the invention, is very favorable, mostly due to the remarkable reduction of time needed to obtain a single crystal of desired big sizes The foregoing and objects are effected by the invention as will be apparent from the following description and claims taken in connection with the accompanying drawings. It should be expressly understood, however, that the drawing is for purpose of illustration only and is not intended as a definition of the limits of the invention.

THE DRAWINGS OF THE INVENTION

The present invention is illustrated by the accompanying drawings in which.

Figure 1:
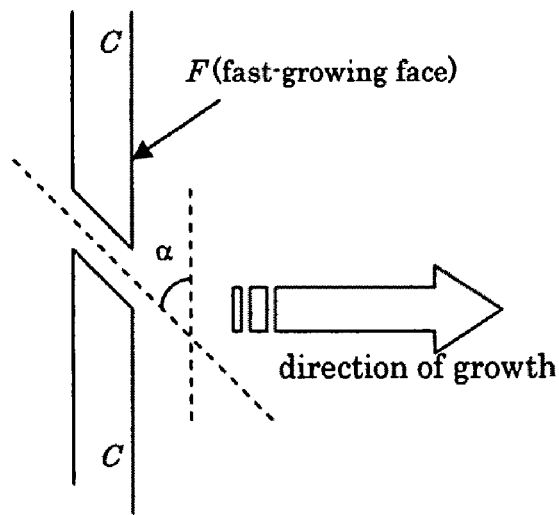
FIG. 1 shows the configuration of elementary seeds in Example 1.
Figure 3:
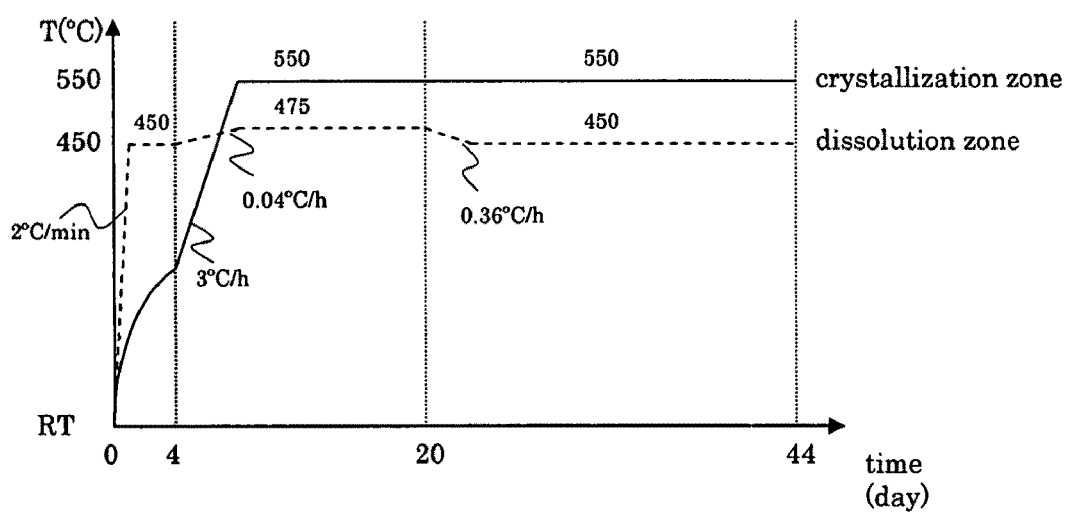
Figure 4:
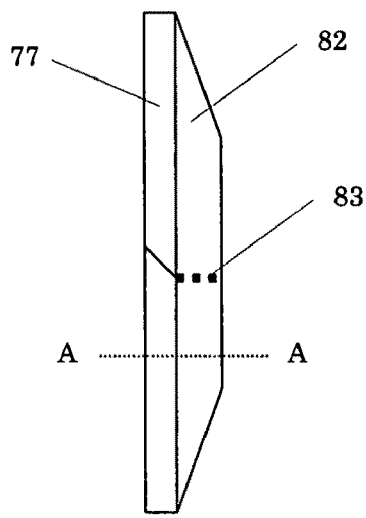
Figure 5:
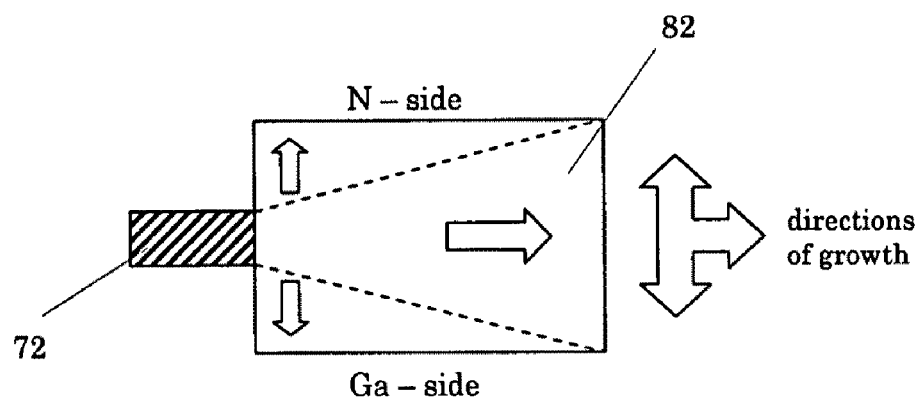
Figures 6A, 6B:
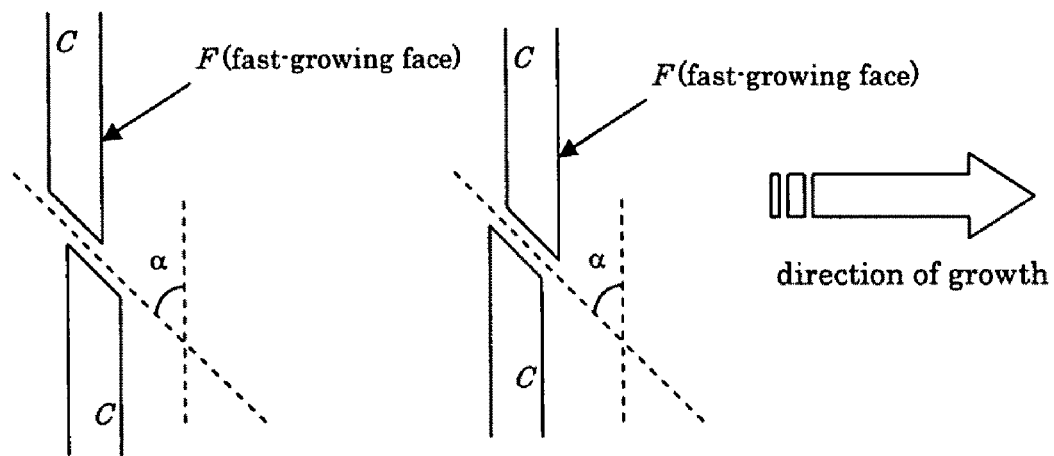
Figure 7:
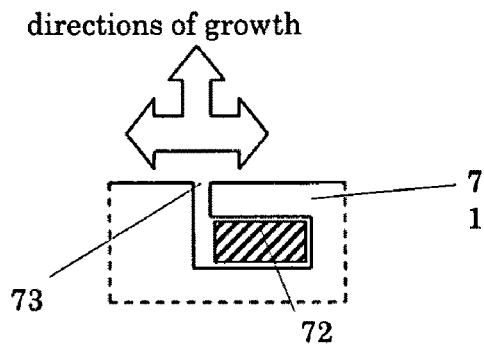
Figure 8:
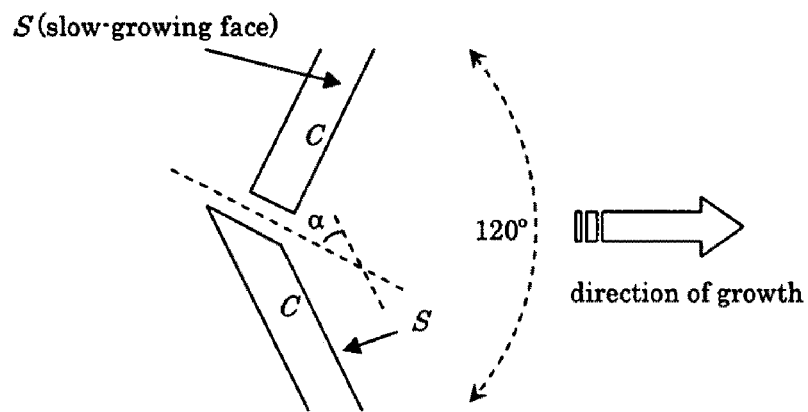
Figure 9:
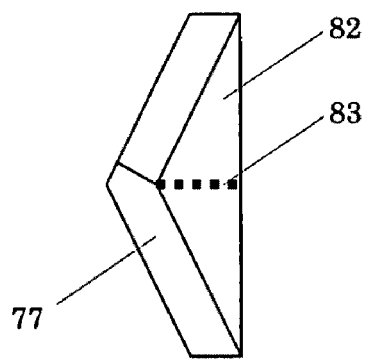
Figure 10:
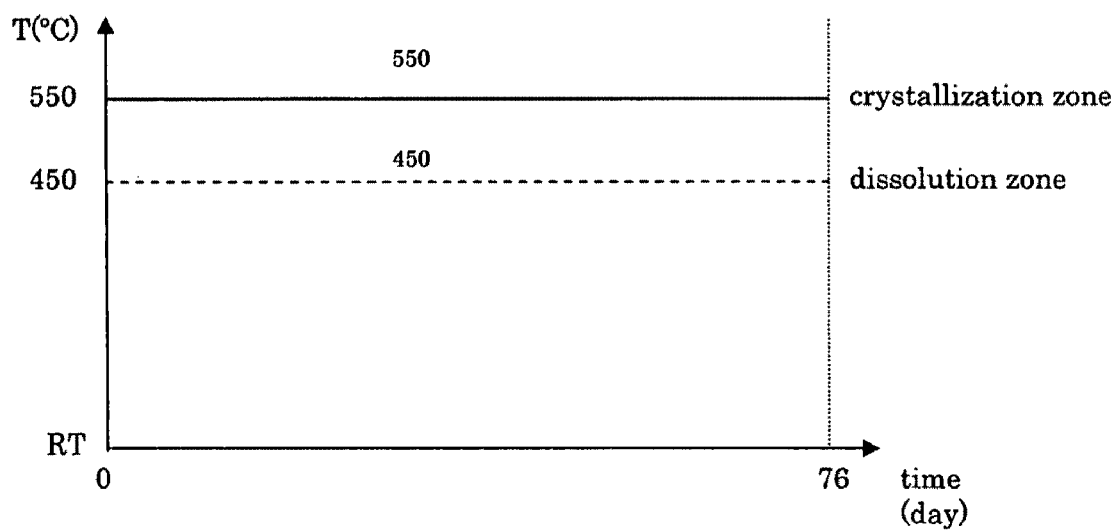
Figure 11:
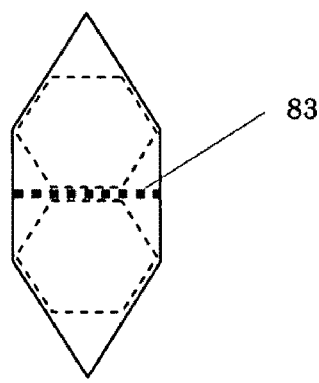
Figure 12:
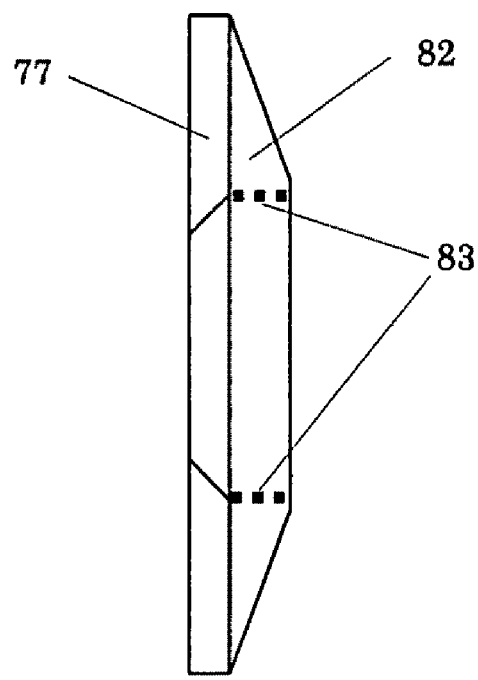
Figure 13:
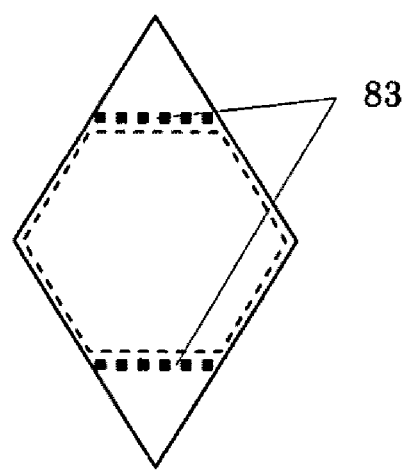
Figure 14:
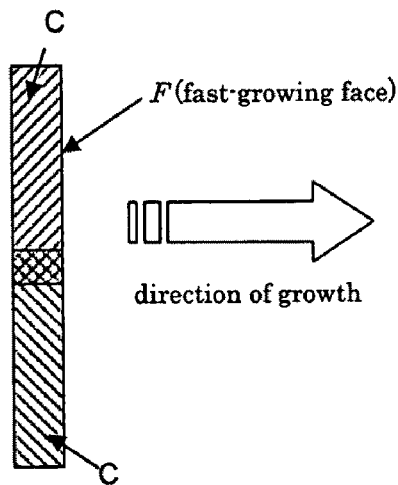
Figure 15:
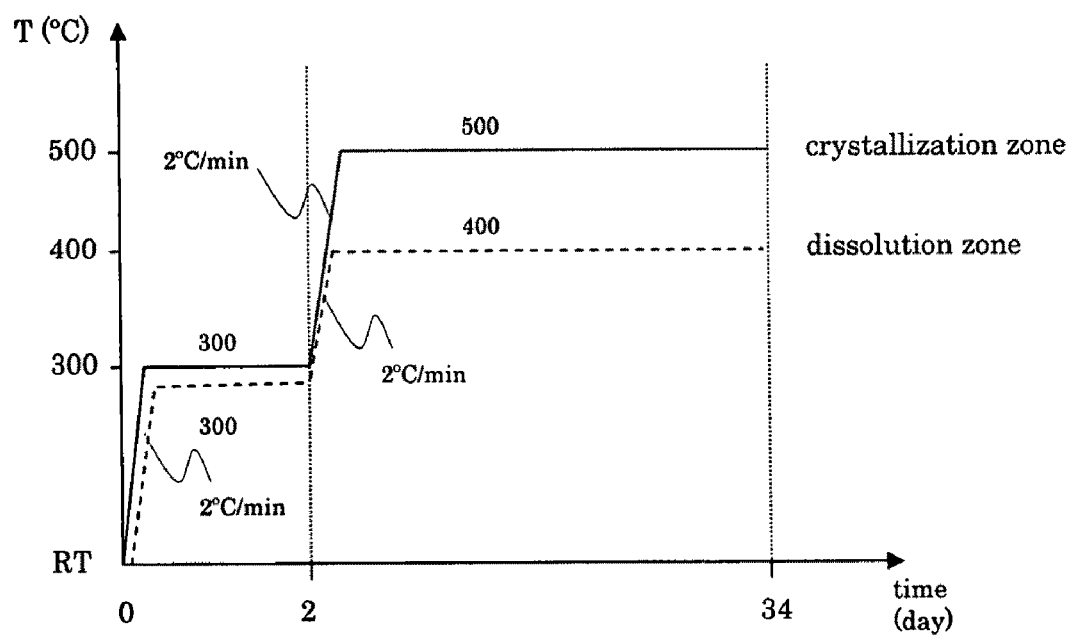
Figure 16:
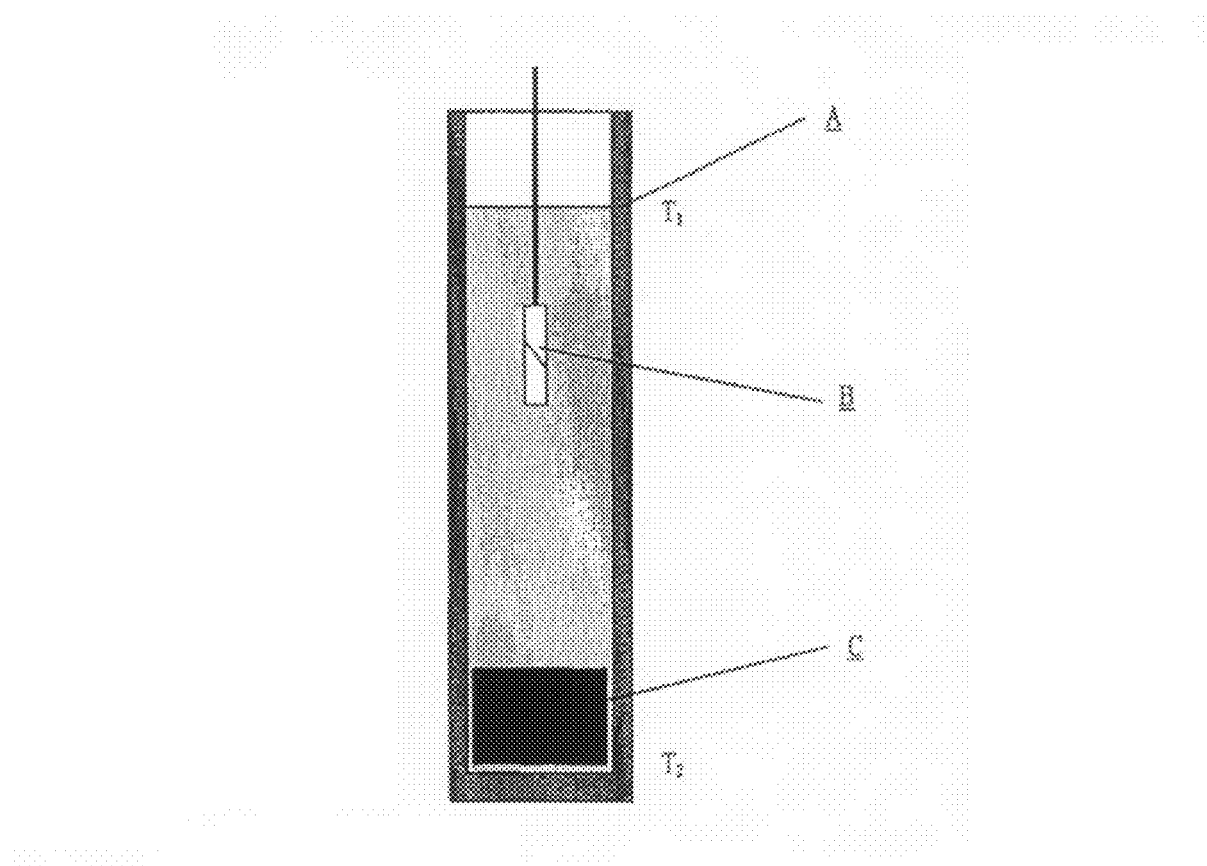
Figure 17:
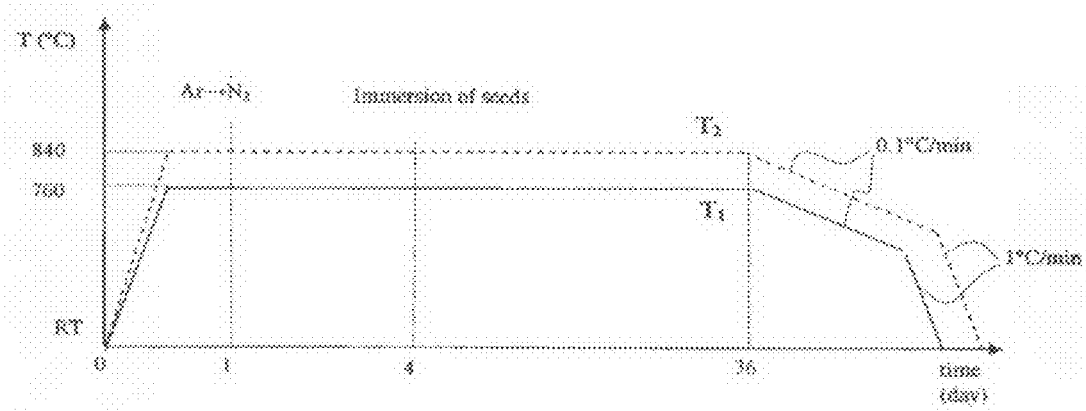
Figure 18:
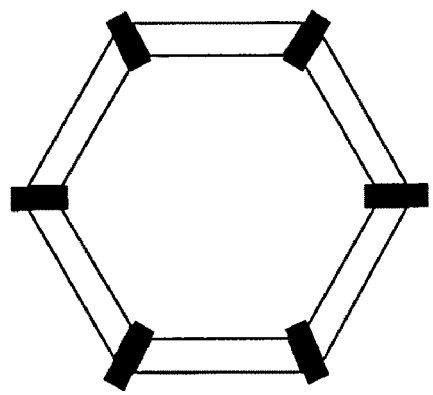
Figure 19A:
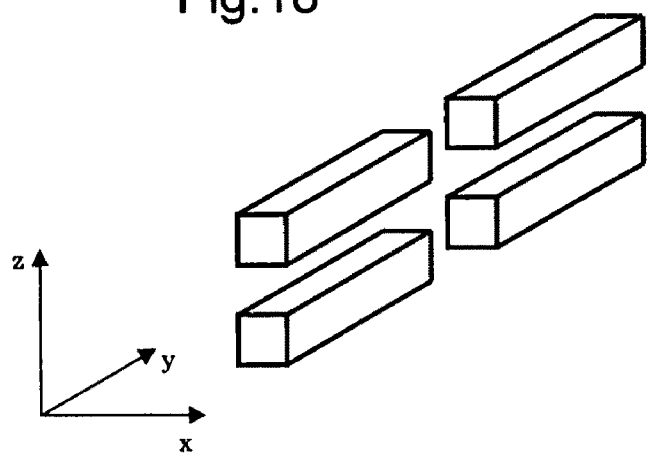
Figure 19B:
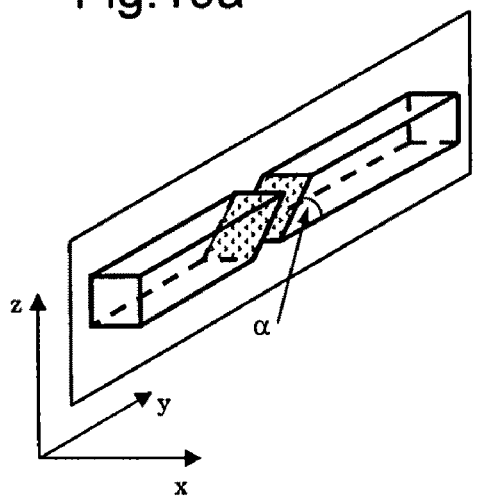
Figure 20:
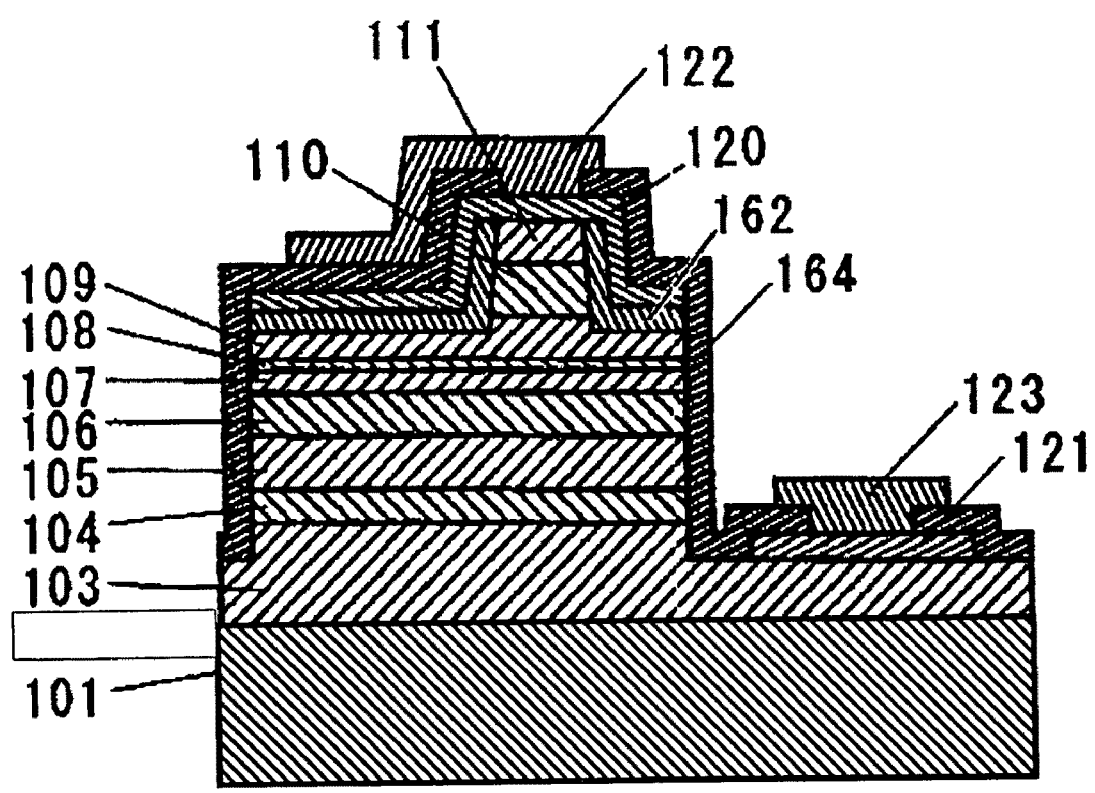
Figure 21:
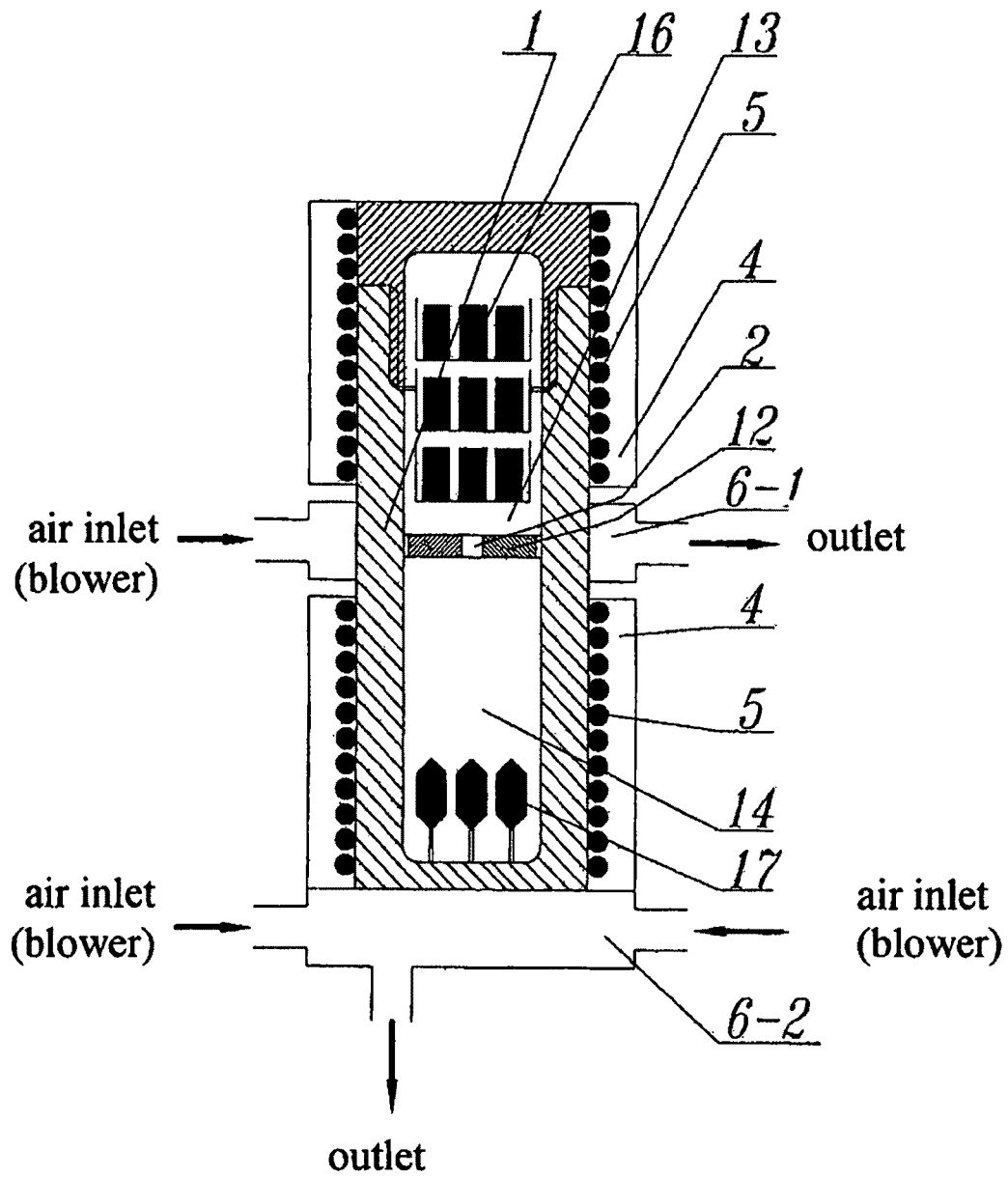
Figure 22:
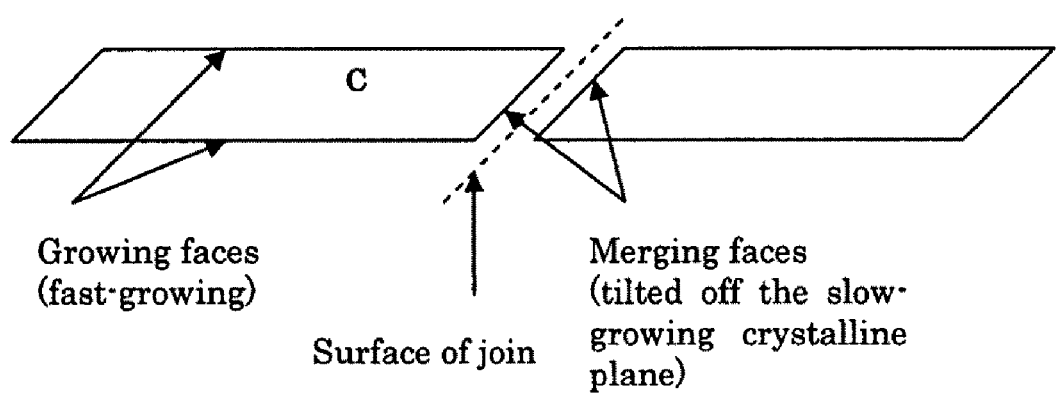
Figure 23A:
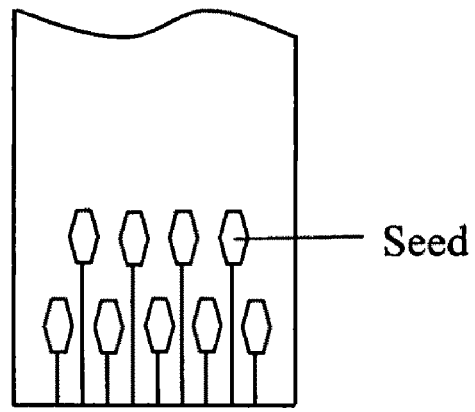
Figure 24A:
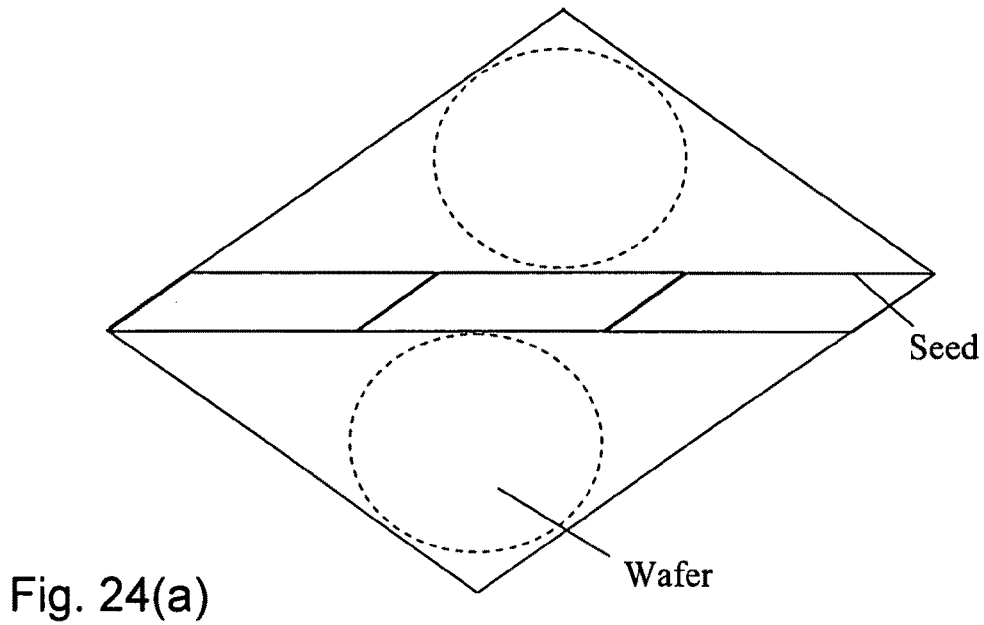
Figure 24B:
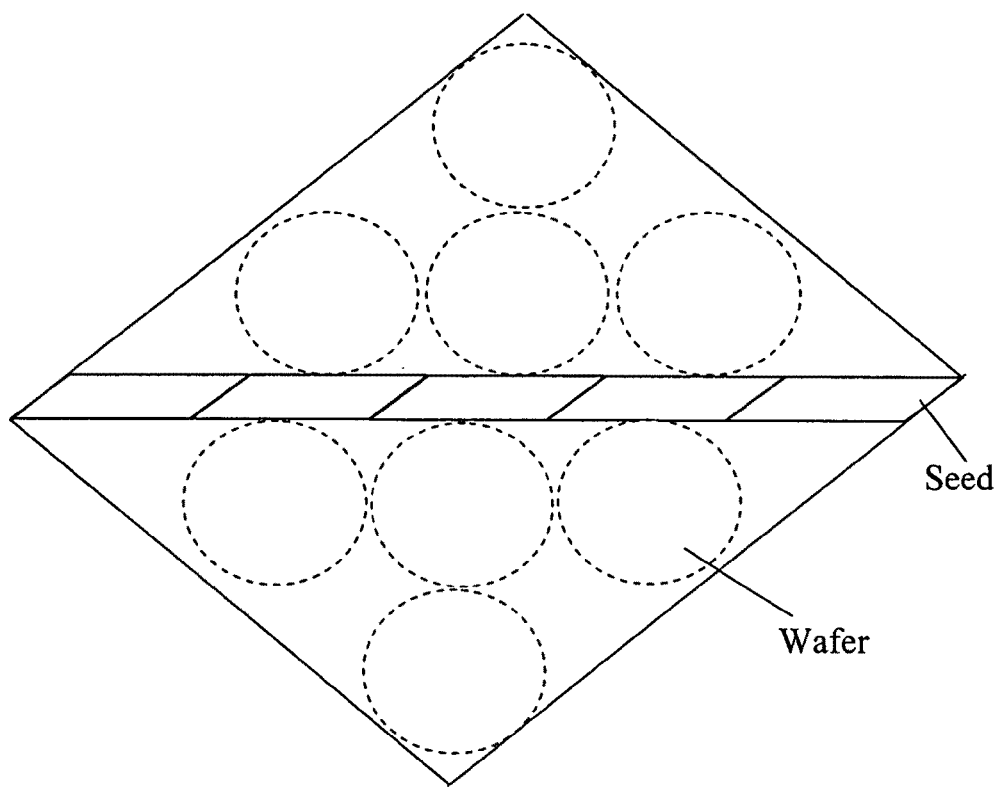

FIG. 3 shows the change of temperature in time inside the autoclave in the process described in Example 1, FIG. 4 shows a scheme of the crystal obtained in Example 1 on merged elementary seeds, FIG. 5 shows a schematic cross-section of the crystal obtained in Example 1 on merged elementary seeds, FIG. 6a presents a selected variant of configuration of elementary seeds presented in FIG. 1, FIG. 6b presents another variant of configuration of elementary seeds presented in FIG. 1, FIG. 7 shows a schematic cross-section of the holder used in Examples 10 to 18, FIG. 8 shows the configuration of elementary seeds in Example 19, FIG. 9 shows a scheme of the crystal obtained in Example 19 on merged elementary seeds, FIG. 10 shows the change of temperature in time inside the autoclave during re-crystallization stage in the process described in Example 20, FIG. 11 shows a scheme of the crystal obtained in Example 20 as the result of further growth on a crystal selected from those obtained processes described in Examples 1 to 18, FIG. 12 shows a scheme of the crystal obtained in Example 25 on merged elementary seeds, FIG. 13 shows a scheme of the crystal obtained in Example 26 as the result of further growth on a crystal obtained in the process described in Example 25, FIG. 14 shows the configuration of elementary seeds in Example 27, FIG. 15 shows the change of temperature in time inside the autoclave in the process described in Example 27, FIG. 16 shows a scheme of the crucible, in which growth of single crystals of gallium-containing nitride by flux method is carried out (Example 28), FIG. 17 shows the change of temperature in time in Example 28, FIG. 18 shows a flat (two dimensional) configuration of elementary seeds in Example 29, FIG. 19a shows a spatial (three dimensional) configuration of elementary seeds in Example 30, FIG. 19b shows another spatial (three dimensional) configuration of elementary seeds, used in Example 31, FIG. 20 presents a transverse cross-section of a nitride semiconductor laser obtained on a substrate according to the present invention, FIG. 21 shows a schematic axial cross section of an autoclave and a set of furnaces, used in the method of crystallization from supercritical ammonia-containing solution, adapted to realization of growth process on more than one seed, FIG. 22 illustrates the definitions of growing faces, merging faces and surface of join, using the example of two neighboring elementary seeds, FIGS. 23(a), (b) and (c) illustrate 3 kinds of arrangement style of a lot of the elementary seeds in the autoclave and FIGS. 24(a) and (b) illustrate a method of cutting off the wafers from the bigger crystal grown on the compound seed.

DEFINITIONS

Any technical terms used throughout the specification and the claims related to the present invention should be construed according to the definitions given below (in alphabetical order):

Autoclave, regardless of its from, includes a closed reaction chamber, in which the crystallization process from liquid phase is carried out, in the range of temperature and pressure given above. For crystallization from supercritical ammonia-containing solution by the method according to the present invention it is preferable to use the apparatus shown schematically in FIG. 21, which is described in details further in the specification.

Chemical transport of gallium-containing nitride in the supercritical solution means a continuous process involving dissolution of a gallium-containing feedstock in the supercritical solution, circulation of the gallium-complex compounds within the solution and crystallization of gallium-containing nitride from the supersaturated supercritical solution. Generally, chemical transport may be caused by temperature difference, pressure difference, concentration difference, or other chemical or physical differences between the dissolved feedstock and the crystallization product. Bulk mono-crystalline gallium-containing nitride according to the invention may be obtained in effect of chemical transport between the dissolution and crystallization zones of the autoclave, established by means of temperature difference between the two zones, whereas the temperature in the crystallization zone should be higher than the temperature in the dissolution zone.

Convection process in this application means a process of crystal growth, in which the transport between feedstock and seeds proceeds essentially by convection.

Crystallization from melt refers to crystallization by flux method.

Crystallographic directions c, a or m refer to c, a or m directions of hexagonal lattice, having the following Miller indices: c—[0001], a—[11 $\bar{2}$ 0], m—[1 $\bar{1}$ 00].

Crystallographic planes C, A or M refer to C—, A- or M-plane surfaces of hexagonal lattice, having the following Miller indices: C—(0001), A—(11 $\bar{2}$ 0), M—(1 $\bar{1}$ 00). The surfaces are perpendicular to the corresponding crystallographic directions (c, a and m).

Diffusion process in this application means a process of crystal growth, in which the transport between feedstock and seeds proceeds essentially by diffusion.

The direction of growth of the seed is the direction of growth of the crystal, out of which the elementary seed (seed) used in the method according to the invention was made. This direction is determined by the method used to produce the seed. At the same time, this is the main direction of propagation of dislocations in the seed. For example, GaN wafers obtained by HVPE method can be used as seeds in the process of GaN growth by crystallization from supercritical ammonia-containing solution. In the HVPE method, the wafers are grown essentially in the c direction of the gallium nitride crystalline lattice. Thus, in this case the c direction is the direction of growth of the seed.

Dissolution of gallium-containing feedstock means either reversible or irreversible process of forming—out of said feedstock—gallium compounds soluble in the supercritical solvent, for example gallium-complex compounds. Gallium complex compounds are complex chemical compounds, in which an atom of gallium is a coordination center surrounded by ligands, such as ammonia molecules ($NH_3$) or their derivatives, like $NH_2^-$, $NH^{2-}$, etc.

ELOG (Epitaxial Lateral Overgrowth) is a method of crystal growth from gaseous phase or from supercritical ammonia-containing solution, in which crystals are grown on a special substrate. In the case of gallium nitride crystals, a matrix of parallel ridges (several microns high and several microns wide), having surfaces susceptible to lateral growth, is created on the surface of the substrate. Typically, gallium nitride crystals are grown in the c direction. The ridges are then created along the m direction and the surfaces susceptible to lateral growth coincide with A-planes. In this case, lateral growth is limited to several or several dozen microns and it is finished as soon as the space between the ridges becomes overgrown by the arising crystal. Next, the principal growth of bulk crystal proceeds along the c direction. This way some of the dislocations present in the substrate can be prevented from penetrating into the arising crystal.

Fast-growing and slow growing crystalline planes and directions: If in the process of growth of a given crystal by a given method it is observed that the growth along some direction(s) of the crystalline lattice is faster than along the other directions, then fast-growing and slow-growing directions are distinguished. Of course, fast-growing directions are those, along which the growth proceeds faster and slow-growing directions are those, along which the growth proceeds slower. Accordingly, crystalline planes perpendicular to fast-growing directions (and crystal surfaces containing those planes) are called fast-growing planes (fast-growing faces), while crystalline planes perpendicular to slow-growing directions (and crystal surfaces containing those planes) are called slow-growing planes (slow-growing faces). These directions depend on the crystal grown (i.e. on the crystallized substance and its crystalline structure) as well as on the selected method of growth. In growth of a gallium containing nitride crystal on a seed in a supercritical ammonia-containing solution containing an alkali metal mineralizer, we have found that the fast-growing crystalline plane is A-plane and the slow-growing crystalline plane is M-plane.

Flux means a substance added to the reaction environment in flux methods, which helps maintain reactants in liquid phase throughout the process.

Flux methods of obtaining crystalline gallium nitride mean a group of methods, in which said azide is obtained as the result of a chemical reaction between liquid mixture of metals (melt) and nitrogen-containing gas (in particular, it may be gaseous nitrogen or a mixture of nitrogen and ammonia). The melt contains among others gallium and flux. Of course, this process proceeds at appropriate temperature and pressure conditions. In the case of sodium, which is a well known flux, typical temperature of the process is ca. 600-800° C., while typical pressure is ca. 5 MPa.

Free growth means a growth of crystal in all possible directions, most often being a combination of straight growth and lateral growth.

Gallium-containing feedstock is gallium-containing nitride or its precursor. As a feedstock, GaN obtained by various methods may be used, among others by flux methods, HNP method, HVPE method or poly-crystalline GaN.

Gallium-containing nitride is a chemical compound containing in its structure at least one atom of gallium and one atom of nitrogen. It includes, but is not restricted to, a binary compound—GaN, a ternary compound—AlGaN, InGaN or a quaternary compound AlInGaN, preferably containing a substantial portion of gallium, anyhow at the level higher than dopant content. The composition of other elements with respect to gallium in this compound may be modified in its structure insofar as it does not collide with the ammonobasic nature of the crystallization technique.

Group XIII element-terminated side, Ga-terminated side, N-terminated side: In the crystals having the wurtzite structure one can distinguish a crystalline direction (crystalline axis) denoted as c, parallel to the $C_6$ symmetry axis of the crystal. In the crystals of Group XIII element nitrides, having the wurtzite structure, the crystalline planes perpendicular to the c axis (C-planes) are not equivalent. It is a habit to call them Group XIII element-terminated side and nitrogen-terminated side or the surface having Group XIII element polarity or nitrogen polarity, respectively. In particular, in the case of mono-crystalline gallium nitride one can distinguish gallium-terminated side (Ga-side) and nitrogen-terminated side (N-side). These sides have different chemical and physical properties (eg. susceptibility to etching or thermal durability). In the methods of epitaxy from the gaseous phase the layers are deposited on the Group XIII element-terminated side. Due to fast growth the fast-growing faces disappear and a crystal bound by slow-growing faces is formed. The crystal then grows slowly, retaining its shape. Thus, fast- and slow-growing directions may be determined from observations of obtained crystals, especially spontaneously formed ones.

Growing faces, merging faced and the surface of join: According to the invention, at least two elementary seeds are placed close to each other and at the initial stage of the process crystalline layers are grown on these seeds until the faces of the crystals touch and thus the seeds are merged into one (larger) compound seed. In course of the process, crystalline layers are grown on the thus-obtained compound seed. The faces of the elementary seeds, which meet at the initial stage of the process, are called merging faces. The surface, on which the merging faces meet, is called the surface of join. The faces of the elementary seeds, on which the growth of crystalline layers may proceed independently of merging, are called growing faces. These definitions are illustrated in FIG. 22). The figure presents two slender-type elementary seeds made of gallium nitride, obtained by HVPE method, used for growth of gallium nitride by crystallization from supercritical ammonia-containing solution.

HVPE (Halide Vapor Phase Epitaxy) method refers to a method of deposition of epitaxial layers from gaseous phase, in which (in the case of nitrides) halides of metals and ammonia are used as substrates.

Lateral growth in this patent application refers to bulk growth on a seed in the direction perpendicular to the original direction of growth of the seed. The straight growth is characterized in that the laterally grown crystal essentially does not "inherit" dislocations from the seed. In contrast to ELOG (Epitaxial Lateral Overgrowth), the lateral growth is definitely macroscopic (of the order of dimensions of the seed or even larger). Moreover, the projection of a laterally grown crystal in the direction parallel to the original direction of seed growth goes remarkably beyond the projection of the seed used. In the case of ELOG (Epitaxial Lateral Overgrowth), these two projections are essentially identical.

MBE (Molecular Beam Epitaxy) method refers to a method of obtaining epitaxial layers of atomic thickness by depositing molecules from a so-called "molecular beam" on a substrate.

Melt in this application means a mixture of molten metals.

Methods of crystallization from liquid phase in this application mean the method of crystallization from supercritical ammonia-containing solution or the flux method.

Mineralizer is a substance introducing into the supercritical ammonia-containing solvent one or more Group I element (alkali metal) ions, supporting dissolution of feedstock.

MOCVD (Metallo-Organic Chemical Vapor Deposition) method refers to a method of deposition of epitaxial layers from gaseous phase, in which (in the case of gallium nitride) ammonia and metallo-organic compounds of gallium are used as substrates.

Polar or non-polar crystalline surface: In crystals of Group XIII element nitrides of wurtzite structure, the crystalline planes parallel to the c axis of the crystal (and crystal surfaces containing those planes) are called non-polar surfaces, whereas, crystalline planes perpendicular to the c axis of the crystal (and crystal surfaces containing those planes) are called polar surfaces.

Polar or non-polar further-processable surface—means a surface suitable for epitaxial deposition of nitride layers, whereon it is possible to produce at least one optoelectronic device. Such surface should have the size sufficient for epitaxy by MOCVD, MBE methods or other method of epitaxial deposition of nitride layers, preferably larger than 10 mm$^2$, and most preferably larger than 100 mm$^2$.

Precursor of gallium-containing nitride is a substance or a mixture containing at least gallium and optionally containing elements of Group I (alkali metals), elements of Group II (alkali earth metals), elements of Group XIII (group numbers according to IUPAC 1989), nitrogen and/or hydrogen, in particular—in elementary form or in the form of alloys or compounds, such as inter-metallic compounds, hydrides, amides, imides, amido-imides and azides, which may form gallium compounds soluble in the supercritical ammonia-containing solvent.

Seeds: Small crystals, which are merged at the initial stage of the process, are called elementary seeds or (shortly) seeds throughout this patent application, while the crystal produced as the result of merging the elementary seeds is called compound seed. In course of the process, crystalline layers are grown on the compound seed. Appropriate selection of seeds is crucial for obtaining a desired bulk gallium-containing nitride monocrystals in a process according to the present invention. In a preferred embodiment of the present invention, the elementary seed may be in a shape selected from the group consisting of column, needle, wafer, rectangular, parallelepiped, parallelogram, trapezium, cube and so on. The edges to be joined of the elementary seeds (i.e. the merging faces) are preferably made to have a taper so as to be joined to each other and the edge surfaces can be designed as C-, A-, M-, R-face or other crystalline surface tilted off the ones listed here. The compound seed may be arranged in a form selected from the group consisting of in one direction extended style as a slender seed and a branch-like seed, in a surround style, in a zigzag style and so on.

Figure 23B:
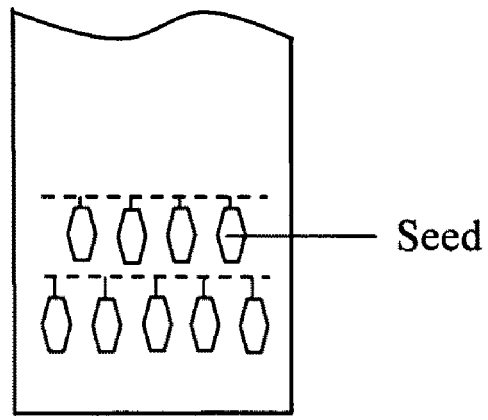
Figure 23C:
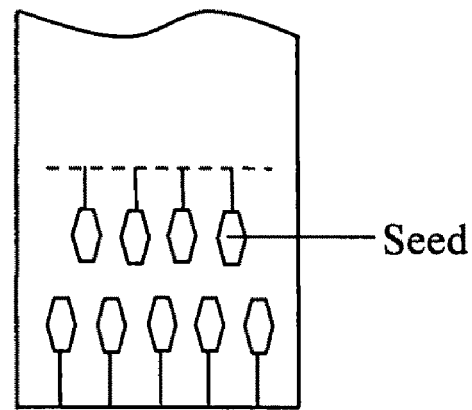

Seed Arrangement in the autoclave: A lot of the elementary seeds are stood up and/or hung down in the autoclave as shown in FIGS. 23 (a) (b) and (c) to get a lot of the compound seeds or wafers at the same time by seeded growth.

Selective crystallization on a seed means a process of crystallization taking place on the surface of the seed, in the absence of spontaneous crystallization or with spontaneous crystallization occurring in a negligible degree. This process is indispensable for obtaining bulk monocrystals of gallium-containing nitride and at the same time it is an essential element of the present invention Solubility: Our experiments show that the state of equilibrium may be achieved between the solid (gallium-containing nitride) and the supercritical solution at sufficiently high temperature and pressure. Therefore, the solubility of gallium-containing nitride may be defined as the equilibrium concentration of gallium-complex compounds obtained in the above mentioned process of dissolution of gallium-containing nitride. In this process, the equilibrium concentration, i.e. solubility, may be controlled by changing the composition of solvent, temperature and/or pressure.

Spontaneous crystallization from the supersaturated supercritical ammonia-containing solution means any undesirable process of nucleation and growth of the gallium-containing nitride crystals taking place at any site within the autoclave except on the surface of the seed. The definition also includes growth on the surface of the seed, in which the grown crystal has an orientation different from that of the seed.

Straight growth means a growth in the direction essentially parallel to the direction of growth of the seed. The straight growth is characterized in that most of the dislocations present in the seed propagate in the crystalline layers grown in this direction. Consequently, the thus-obtained crystalline layers have the surface dislocation density similar to that of the seed used.

Substrate of bulk mono-crystalline gallium-containing nitride means a mono-crystalline substrate of gallium-containing nitride, on which electronic devices such as light emitting diodes (LED) or laser diodes (LD) may be obtained by MOCVD method or by the methods of epitaxy growth such as HVPE.

Supercritical ammonia-containing solution means a solution obtained as the result of dissolution of gallium-containing feedstock in the supercritical ammonia-containing solvent.

Supercritical ammonia-containing solvent is a supercritical solvent consisting at least of ammonia, which contains one or more types of Group I elements (alkali metals), supporting dissolution of gallium-containing nitride. Supercritical ammonia-containing solvent may also contain derivatives of ammonia and/or mixtures thereof, in particular—hydrazine.

Supersaturation: If the concentration of soluble gallium compounds in the supercritical ammonia-containing solution is higher than the solubility of gallium-containing nitride in specific physico-chemical conditions, then the supersaturation of the supercritical ammonia-containing solution with respect to gallium-containing nitride in those conditions can be defined as the difference between the actual concentration and the solubility. While dissolving gallium-containing nitride in a closed system it is possible to obtain the supersaturation state, for example by increasing temperature or decreasing pressure.

Temperature and Pressure Coefficient of Solubility (TCS and PCS)

Negative temperature coefficient of solubility means that the solubility is a decreasing function of temperature if all other parameters are kept constant. Similarly, positive pressure coefficient of solubility means that, if all other parameters are kept constant, the solubility is an increasing function of pressure. Our research allows to state that solubility of gallium-containing nitride in the supercritical ammonia-containing solvent, at least in the temperature range from 300° C. to 550° C., and pressure from 100 MPa to 550 MPa, shows a negative temperature coefficient (negative TCS) and a positive pressure coefficient (positive PCS).

Temperature and pressure of the reaction: In the practical example presented in the present specification temperature measurements inside the autoclave have been performed when the autoclave was empty, i.e. without the supercritical ammonia-containing solution. Thus, the temperature values cited in the examples are not the actual temperature values of the process carried out in the supercritical state. Pressure was measured directly or calculated on the basis of physical and chemical data for ammonia-containing solvent at selected process temperature and the volume of the autoclave.

DETAILED DESCRIPTION OF THE PREFERRED EMBODIMENTS ACCORDING TO THE INVENTION

The issue of obtaining the bulk single crystals through a method of crystallization on the seed does not exist in the case of substances easily crystallizing from super-saturated solutions or from melts. Bulk single crystals of such compounds can be easily obtained by the widely known Czochralski method.

In the case of nitrides of Group XIII, containing gallium, the Czochralski method, or a similar one, cannot be used due to a close neighbourhood of temperature of melting and the temperature of decomposition of many such nitrides.

The environment of supercritical nitrogen-containing solvent, such as ammonia or hydrazine, provides promising conditions of the growth of the bulk single crystals, under the condition of availability of the appropriate seeds. Even though the crystallization from the supercritical ammonia-containing solution, as a equilibrium method, allows a clear reduction of defects of crystalline lattice of gallium-containing nitride single crystals and allows improvement of the quality of single crystals along with the thickness of the crystallized layers, the drive to obtain a defect-free crystalline material for seeds and single crystals of gallium-containing nitride, which are defect-free throughout their volume, is understood, as it would allow free shaping of defect-free wafers of any characteristics of the surface and any orientation with respect to selected axis of crystalline lattice.

While analyzing own experience in the field of conducting the method known from the WO 02/101120 publication, and experimentally verifying the publications on the methods of obtaining the gallium-containing nitrides in a form of single crystals, it has been established, that the growth of bulk single crystals of gallium-containing nitride proceeds at different rate in various environments and additionally at different rate in the direction of various hexagonal axis of wurtzite type crystalline lattice, in which the gallium nitride, as well as other gallium-containing nitrides, is crystallized. The information is implied by the form of a gallium-containing nitride single crystal obtained as a result of a spontaneous crystallization in processes of obtaining single crystals of such nitrides.

It has been established, that the volume parameters of a gallium-containing nitride single crystal obtained by the growth method from the supercritical ammonia-containing solution are, on one side, the result of the size, shape and orientation of the seed, and on the other side, of the length of the process and the amount of the feedstock in the system.

Observation of the shape of the crystals which are formed as a result of a spontaneous nucleation and the disappearance of growing faces on seeds in the conditions of free crystallization conducted according to the method known from WO 02/101120, currently allows for establishing the directions of the fast growth of bulk single crystals.

From the unpublished—so far—results of research on the method of growth from the supercritical ammonia-containing solution, it results that the growth of the crystal in the direction parallel to the c axis, as well as in the direction perpendicular to c axis is possible, even though such growth is substantially limited geometrically and can be very slow. It was noticed, that as a result of such limitations in a long-term process of free crystallization from the supercritical ammonia-containing solution, one can obtain extended crystals with a hexagonal intersection.

At the same time, as a result of the unpublished—so far—experiments on the flux method, we obtained access to gallium-containing nitride single crystals, which, in the conditions of this method, grow in a direction perpendicular to c axis.

The experiments led to unexpected observations in the scope of propagation of defects of the crystalline lattice appearing in the seeds. The defects were not propagating, if the growth of the single crystal is led in the direction parallel to the direction of growth of the seed. The growth of the single crystal in this direction is called lateral growth throughout this documentation.

Until recently, the source of the mono-crystalline seeds of the gallium-containing nitride were crystals obtained through HVPE method, grown in the direction parallel to the c axis on hetero-substrates of similar, but not identical, parameters of the crystalline lattice and different characteristics of the thermal expansion. Physico-chemical differences between the hetero-substrates and the gallium-containing nitride deposited on a given substrate were the reason for defects of the crystalline lattice of the thus-obtained gallium-containing nitride single crystals.

In the WO 03/035945 publication, it was disclosed, that some structural defects of the seeds can be eliminated by suppressing the free growth of the single crystals by limiting the access to crystalline surfaces, on which the growth is undesired, by, for example, joining of two flat seeds having crystalline surfaces perpendicular to the c axis in such a way, that the sides of Ga-polarity were directed at each other and placed near by, in order to obtain single crystals growth of gallium nitride only on the side of N-polarity. The growth described in this publication was still only a growth in the direction parallel to the direction of growth of the seeds.

As it is proved by the above referred observations, the growth of the gallium-containing nitride in all known methods takes place at least partly in a direction parallel to the direction of the seed growth, which is obtained by the same or different method, which, unfortunately, means that in the deposited mono-crystalline layers of gallium-containing nitride, at least a partial propagation of crystalline defects present in the seeds takes place.

It has been stated that the establishing of the privileged growth directions of crystals and the appropriate preparation of the seeds can lead to obtaining the bulk single crystals of gallium-containing nitride of given dimensions and qualities.

By limiting the access to the surface of straight growth, currently a lateral growth has been forced in a direction perpendicular to the c axis. Contrary to the growth in the direction parallel to the c axis, the duration of the process is, in this case, not the most important factor influencing the size of the wafers which are grown in the direction perpendicular to the c axis. The dimensions are mostly limited due to the disappearance of the fast-growing faces parallel to the c axis and "closing" of the crystal by the slow-growing faces.

Currently, the solution of the above problems deriving from the disappearance of the slow-growing faces parallel to the c axis provided an unexpected use of compound seeds, obtained from a few smaller elementary seeds, as a result of their merging. In the process of conducted research, it has been defined that the condition for success in obtaining the developed surface of lateral growth, parallel to the c axis is to provide the consistence of crystallographic axis of all seeds, and to expose the fast-growing faces on the neighboring seeds, and, moreover, to create merging faces on the seeds, that is to direct towards one another the faces, which are essentially different from the slow-growing faces of the gallium-containing nitride crystal (FIG. 22). In general, the seeds which are used should have the merging faces essentially different from the slow-growing faces of the obtained crystal, and should also have the fast-growing growing faces. Fast growth of the crystal on the merging faces of the seeds results in the merging of the neighboring elementary seeds, under the condition of consistent orientation of the crystalline axis of these seeds.

According to the invention, at least two elementary seeds are placed close to each other and at the initial stage of the process crystalline layers are grown on these seeds until the faces of the crystals touch and thus the seeds are merged into one (larger) compound seed. In course of the process, crystalline layers are grown on the thus-obtained compound seed. The faces of the elementary seeds, which meet at the initial stage of the process, are called merging faces. The surface, on which the merging faces meet, is called the surface of join. The faces of the elementary seeds, on which the growth of crystalline layers may proceed independently of merging, are called growing faces.

These definitions are illustrated in FIG. 22). The figure presents two slender-type elementary seeds made of gallium nitride, obtained by HVPE method, used for growth of gallium nitride by crystallization from supercritical ammonia-containing solution.

According to the invention, the bulk single crystals of big size are obtained through the use of compound seeds, resulting from merging of at least two elementary seeds.

There are two stages in the method of obtaining bulk single crystals of big sizes. In the first one (the preliminary), the deposition of the crystallized layers on elementary seeds with appropriately prepared growing faces, and while retaining the appropriate inventive spatial configuration of elementary seed with respect to each other, leads to the merging of elementary seed into a compound seed.

In the later stage, a directed growth is conducted on the compound seed, wherein this growth can be lateral, straight, or alternate growth of both of these types, or it can be a free growth.

Both stages of this method can be conducted in one process with the use of the same environment of their growth of the crystalline layers, or in separate processes, in which the compound seeds are obtained separately, and then the growth on such compound seeds is conducted separately. In this embodiment of the invention, it is possible to use different environments of crystallization in each stage of the process.

Obtaining of compound seeds of desired dimensions and shape requires appropriate processing of elementary seeds.

Elementary seeds may have a flat (two-dimension) configuration or any spatial (three-dimension) configuration. However, an appropriate preparation of growing and merging faces of each elementary seed is the primary condition of merging them into a compound seed, and additionally configuring the position of elementary seeds that are to be merged with respect to one another in such a way that their merging is effective in a short period of time. It is important to observe the desired angles between growing and merging faces of elementary seeds.

This is possible by application of holders that stabilize the position of elementary seeds towards each other. In a preferred embodiment of the present invention such holders will not only be used to maintain the appropriate position of elementary seeds towards each other, but also to limit undesired direction of growth.

Merging of elementary seeds is performed not only to obtain larger compound seeds, but also to configure a compound seed in such a way to make it possible to obtain a developed surface of at least one fast growing face as a result of eliminating undesired dislocations and displacements in the compound seed.

Preferably, the process of obtaining a single crystal of large dimensions is conducted until disappearance of fast-growing faces. However, the crystallization process may be stopped both prior to the final disappearance of fast-growing faces, as well as the process may be continued after fast growing faces have disappeared thus proceeding to the slow growing phase of a single crystal by depositing subsequent layers on slow-growing faces developed through disappearance of fast-growing faces.

Depending on the type of the crystallized substance, the target use of the produced bulk single crystal and the selected crystallization method, the dimensions and fast growing faces uncovered on a compound seed are selected.

The method according to the present invention is preferably used to obtaining of bulk mono-crystalline gallium-containing nitride.

Depending on the orientation of the compound seed's faces towards the axis of the crystalline lattice of gallium-containing nitride it is possible to influence—to a large extent—the shape of the bulk mono-crystalline gallium-containing nitride.

The obtained single crystal of gallium-containing nitride may for example have a shape of a flat wafer or a polyhedron that may subsequently be cut into many wafers with the required orientation with respect to the crystalline lattice that have a non-polar crystalline surface or a crystalline surface of required polarity.

It should be emphasized that wafers obtained as a result of cutting the produced single crystal may be elementary seeds in the method according to the present invention and in another process they may be subjected to merging into a larger compound seed thus eliminating any constrains as to the range of sizes of compound seeds used in the inventive method, and therefore also to the range of sizes of the bulk single crystal produced from these seeds.

In case of producing a single crystal of gallium-containing nitride the growth of crystal on the compound seed is preferably conducted by a crystallization from the supercritical ammonia-containing solution.

Alternatively, according to the present invention, growth is conducted by the crystallization method from melt (FLUX method).

Seeds formed from single crystals of gallium-containing nitride grown along the c direction are one of the sources of elementary seeds used in the discussed process.

An example of such a seed is a single crystal of gallium-containing nitride in the form of a wafer that is oriented perpendicularly to the crystalline c axis, produced by a growth method from the gaseous phase, preferably HVPE method, with the surface dislocation density not higher than $10^8/cm^2$.

Also, a single crystal of gallium-containing nitride produced with the HNP method may be used as a seed with a very low surface dislocation density.

Additionally, a single crystal of gallium-containing nitride obtained with the flux method as a result of spontaneous crystallization may be used as a seed in the form of a hexagonal wafer.

According to the present invention, the bulk single crystal of gallium-containing nitride may be produced by a controlled growth of the single crystal along the selected direction, including at least one growth phase into the direction perpendicular to the crystalline c axis and at lease one growth phase into the direction parallel to the crystalline c axis in the supercritical ammonia-containing solution, using the feedstock and the seed.

Typically, however, gallium-containing nitride wafers obtained by the HVPE method are used for the production of bulk single crystals of gallium-containing nitride according to the present invention.

Preferably, elementary seeds grown in the c direction and having fast-growing growing faces are set up with respect to each other in such a way that their growing faces make a 180° angle, while the angle between the surface of join and at least one of the growing faces is from 30° to 90°, preferably from 30° to 75°, most preferably 45° or 60°.

Alternatively, in elementary seeds grown into the c direction, slow growing faces may be uncovered and the seeds may be set up in such a way that their growing faces will make a 120° angle, while the angle between the surface of join and at least one growing face is from 0° to 60°, preferably 15°, 30° or 45°.

Preferably, elementary seeds of both types are polyhedrons with appropriately formed growing and/or merging faces.

Preferably, such seeds are in the shape of flat wafers and lay on one plane.

Preferably still, growing and/or merging faces of such seeds are polished.

According to the present invention, elementary seeds grown in the direction perpendicular to the c axis and having fast-growing growing faces are also used to obtain single crystals of gallium-containing nitride.

Preferably, such elementary seeds are polyhedrons with appropriately formed growing and/or merging faces.

Preferably still, such seeds are in the shape of flat wafers and lay on one plane.

Preferably, growing and/or merging faces of such elementary seeds are polished.

In the case of gallium nitride seeds, the preferred length of elementary seeds is from 25 mm to 100 mm, while the preferred length of the compound seed in this case is from 50 mm to 250 mm. The preferable gallium-containing nitride single crystal obtained on such seeds has the surface area of the section perpendicular to the c axis from 5 cm$^2$ to 120 cm$^2$.

A preferable single crystal obtained according to the present invention is a single crystal of gallium-containing nitride, and in particular gallium nitride single crystal. According to the present invention, it is possible to produce a single crystal of gallium-containing nitride whose longest linear dimension is at least 2.5 cm (1 inch), preferably at least 5 cm (2 inches), and most preferably at least 10 cm (4 inches).

Preferably, in addition such a single crystal has the linear dimension of at least 2.5 cm (1 inch), preferably at least 5 cm (2 inches), most preferably at least 10 cm (4 inches), along at least one direction perpendicular to the direction of the longest linear size.

According to the present invention, the single crystal of gallium-containing nitride, in particular gallium nitride single crystal, has FWHM value of X-ray rocking curve from (0002) plane below 60 arcsec, preferably about 20 arcsec (for Cu K α1 line).

According to the present invention, the single crystal of gallium-containing nitride, in particular gallium nitride single crystal, has a large radius of curvature of the crystalline lattice, preferably larger than 15 m, and preferably still of more than 30 m, and most preferably of abut 70 m.

According to the present invention, the single crystal of gallium-containing nitride, in particular gallium nitride single crystal, has the surface dislocation density (EPD) below $10^4/cm^2$, and preferably not more than $10^2/cm^2$.

Preferably, the single crystal of gallium-containing nitride produced according to the presented invention, in particular gallium nitride single crystal, has at the same time all the preferable features as indicated above.

As mentioned, gallium-containing nitrides, and gallium nitride in particular are valuable material used in the optoelectronic industry.

The present invention also relates to semiconductor structures deposited on substrates cut out or formed from the single crystal obtained according to the present invention, which allows producing single crystals of gallium-containing nitrides having large dimensions.

Perfect quality of the substrate and the low surface dislocation density is the condition of using them in the optoelectronic industry.

The present invention allows for obtaining single crystals of gallium-containing nitride that satisfy these criteria, since as a result of controlled growth of the produced single crystal in selected directions—until fast-growing faces disappear, it is possible to produce single crystals the growth of which in its entirety or dominant part occurs in the direction perpendicular to the direction of growth of the elementary seed, and—as a result in these areas there is no propagation of defects of the crystalline lattice that are present in elementary seeds.

Bearing in mind that at least some of nitride semiconductor layers present in optoelectronic devices require for deposition the use of the MOCVD method, during the production of such devices there is a high demand for substrates for epitaxy with a large epitaxial area in the plane that is perpendicular to the c axis of the crystal of gallium-containing nitride.

The present invention provides for satisfaction of such demand owing to the possibility of using compound seeds obtained through merging of elementary seeds originally grown in the direction of the c axis, and having significant size of fast-growing faces parallel to the c axis of the crystalline lattice, and also owing to the possibility of selectively conducting the growth on such seeds in the direction that is perpendicular to the c axis of the crystalline lattice. The longest linear dimension of fast-growing faces of the compound seed used for this purpose is preferably located in the plane that is parallel to the c axis of the single crystal of gallium-containing nitride. This process has been illustrated in FIG. 4 and FIG. 5. Under such conditions, defects of seed crystals are not propagated in the single crystal grown in the described compound seed, which leads to substantial reduction of the surface dislocation density of the produced single crystal compared to the seed.

According to the present invention, growth of single crystals on a seed may be carried out by a crystallization method from the supercritical nitrogen-containing solution, preferably from the supercritical ammonia-containing solution.

In one of the embodiments of this method, in the autoclave, during the crystallization stage, there is gallium-containing feedstock, preferably crystalline gallium nitride, elements of Group I and/or their mixtures and/or compounds, in particular containing nitrogen and/or hydrogen, preferably azides, optionally with the addition of Group II elements and/or their compounds, constituting a mineralizer, and the mineralizer together with ammonia functions as an ammonia-containing solvent. The crystallization of the desired gallium-containing nitride is conducted from supercritical ammonia-containing solution on the surface of the seed, at the crystallization temperature which is higher, and under the crystallization pressure which is lower, than the temperature and pressure of the dissolution of feedstock. Two temperature zones are created. In the dissolution zone feedstock is placed and in the crystallization zone—more than one elementary seed and then at least two elementary seeds are merged into one compound seed in the initial phase of the process, while the dissolution zone is located higher than the crystallization zone, and the transport of mass occurs between the dissolution and crystallization zones.

Preferably, the temperature difference between the dissolution and the crystallization zones is from 1° C. to 150° C., preferably from 10° C. to 100° C., and in the crystallization zone, temperature is not lower than 350° C., preferably not lower than 400° C., and most preferably is from approximately 500° C. to 550° C.

Bulk single crystals of gallium-containing nitride according to the invention is preferably created by conducting its growth in the direction perpendicular to the direction of the growth of the seed from mono-crystalline gallium-containing nitride having the same chemical composition by growth technique from supercritical ammonia-containing solution.

Preferably, one uses the method disclosed in WO 02/101120, but depending on the chemical composition of the gallium-containing nitride, one can apply other conditions and parameters of the process of crystallization from supercritical ammonia-containing solution, in particular as regards the feedstock being used, mineralizers being used as well as pressure and temperature conditions in the particular stages of the crystallization process, including the deviation from the purely ammonobasic character of the environment from which gallium-containing nitride is crystallized.

Another preferable growth method is the flux method which is conducted in the liquid phase from gallium-containing melt, preferably on the basis of lithium.

Due to the different conditions of the crystallization process under the flux method, in this method fast-growing and slow-growing planes may be different from fast-growing and slow-growing planes in the process of crystallization from supercritical ammonia.

According to the invention, proper sizes and shapes of elementary seeds for the obtaining of bulk mono-crystalline gallium-containing nitride may be possibly achieved by subjecting the seed to the initial process consisting in the alternate growth in the direction parallel to the c axis and in the direction perpendicular to the c axis of the crystalline lattice of gallium-containing nitride. The alternate growth of the crystal in the desired directions is conducted, for example, by alternately applying the growth by the flux method from Ga—Li melt in the direction perpendicular to the c axis as well as the growth from supercritical ammonia-containing solution in the direction parallel to the c axis. As an alternative, one of those methods is used by alternately exposing, in the subsequent stages, growth planes in the desired direction with the simultaneous restriction of growth in the perpendicular direction.

Exemplary measures used for restricting the growth of single crystals of gallium-containing nitride in the selected direction have been disclosed in publication WO 03/035945.

According to the invention, bulk mono-crystalline gallium-containing nitride may be doped with donor- and/or acceptor- and/or magnetic-type dopants at concentrations from $10^{17}/cm^3$ to $10^{21}/cm^3$. The doping makes the inventive gallium-containing nitride an n-type, p-type or compensated (semi-insulating) material.

Doping is conducted by the introduction of adequate doping compounds to the growth environment of single crystals. In the case of Group XIII element nitrides, in particular, gallium nitride, exemplary acceptor-type dopants are magnesium and zinc, donor-type dopants—silicon, and magnetic-type dopants—manganese. The mentioned elements may be introduced to the process environment with starting materials in a pure (elemental) form or in the form of compounds.

Devices for conducting crystallization in the method according to the invention are generally known.

The crystallization of gallium-containing nitride from supercritical ammonia-containing solution may be conducted for example in the device disclosed in publication WO 02/101120. One can use autoclaves with different constructional details, resulting among other things from the scale of a device.

The section of the exemplary preferable device for the growth from the supercritical ammonia environment is presented in FIG. 21.

This is a device for obtaining mono-crystalline gallium-containing nitride and is characterized in that it has autoclave 1 for producing supercritical solvent, said autoclave is equipped with installation 2 for establishing convection flow, placed in a set of furnaces 4 equipped with heating device 5 and/or cooling device 6.

The set of furnaces 4 has a high-temperature zone, coinciding with crystallization zone 14 of autoclave 1 which has heating device 5 and/or cooling device 6, as well as a low-temperature zone, coinciding with dissolution zone 13 of autoclave 1 with heating devices 5 and/or cooling devices 6. Installation 2 has a horizontal baffle (or baffles) 12, possessing central and/or circumferential openings, which separates crystallization zone 14 and dissolution zone 13. In autoclave 1, feedstock 16 is placed in dissolution zone 13, and at least two seeds 17 are placed in crystallization zone 14, and the flow of supercritical solution between zones 13 and 14 is established by installation 2. It is characteristic that the dissolution zone 13 is situated above the horizontal baffle or baffles 12, while crystallization zones 14 is situated below horizontal baffle or baffles 12.

GaN shows good solubility in supercritical $NH_3$, if alkali metals or their compounds such as $NaNH_2$ or $KNH_2$ are introduced to it. The research conducted by the inventors shows that solubility is an increasing function of pressure and a decreasing function of temperature. On the basis of the determined relations, it is possible to carry out the present invention and to create desired crystals.

Feedstock is placed in the upper zone of the reactor. The zone is maintained in a different temperature condition than the bottom zone of the reactor, where at least two mono-crystalline seeds are placed.

In particular, the negative temperature coefficient of solubility of GaN in the reaction environment means that, as a result of creation of a temperature gradient, one can force the chemical transport of gallium nitride in the system from the reactor upper zone with a lower temperature—which is the dissolution zone of crystalline gallium nitride being feedstock—into the bottom zone with a higher temperature—which is the crystallization zone.

The application of crystalline gallium nitride as preferable feedstock in the process of re-crystallization of GaN is favourable due to the fact that it provides the amount of gallium required for the conduction of the process in the form which is easily soluble and gradually transferred into the solution.

Alkali metals, their compounds, especially containing nitrogen and hydrogen and their mixtures, may be used as mineralizers. Alkaline metals may be selected from Li, Na, K, Rb and Cs, and their compounds may be selected from hydrides, amides, imides, amido-imides, nitrides and azides.

The environment of supercritical ammonia-containing solution with the addition of alkaline metal ions, used for the creation of bulk single crystals of gallium nitride according to the invention, may also contain ions of other metals and soluble forms of other elements, introduced purposely in order to modify the features of mono-crystalline gallium nitride being produced. However, this environment also contains accidental impurities introduced with starting materials and released to the environment during the process from the elements of the apparatus. The restriction of the content of accidental impurities is possible by use of reagents of very high purity, or even additionally purified for the needs of the process. Impurities which derive from the apparatus are subject to control as well, by a proper selection of constructional materials, in compliance with rules known to those skilled in the art.

Preferably, the controlled growth of the crystal by the method according to the invention is conducted in the way described in details in examples given below and illustrated with charts showing the relation of temperature and the duration of the process, presented in the attached figure.

In accordance with FIG. 3, during the stage of crystallization from supercritical ammonia-containing solution, in the upper zone being the dissolution zone of the autoclave presented schematically in FIG. 21 (and described above in more details), temperature is maintained which is lower than the temperature in the crystallization zone maintained essentially at the fixed level during the whole stage of crystallization.

In those conditions—as a result of the creation of temperature difference between the zones and a temperature gradient—in the dissolution zone, feedstock is being dissolved, and as a result of convection, chemical transport between zones is forced and the selective crystallization of GaN on seeds is conducted by achieving the super-saturation of supercritical ammonia-containing solution with respect to GaN in the crystallization zone.

During the growth from supercritical ammonia-containing solution, the value of the temperature difference between the zones may be changed within broad limits and preferably is from a few degrees centigrade to hundred and several dozen degrees centigrade. In addition, according to the invention, the temperature difference between the zones may be changed during the process. In this way one can control the growth rate and quality of mono-crystalline gallium nitride being produced.

Additionally, this basic process may be modified and modification may consist, for example, in periodical changes of temperatures in both the zones, however, the temperature in the crystallization zones must always be higher than the one in the dissolution zone.

While working on the optimization of the flux process which is currently used for the controlled growth of crystals of gallium-containing nitride, molybdenum crucibles presented in FIG. 16 were used. They were placed in a high-temperature reactor with controlled atmosphere, adjusted to operate in high-pressure conditions and equipped with zonal heating devices. In FIG. 16 crucible A is filled with Li—Ga melt with an additional flux selected from the group comprising Bi, In, K, Na, Pb, Rb, Sb, Sn and Te. On the bottom of crucible A, there is crystalline feedstock C in the form of GaN, which is an internal source of nitrogen. Elementary seeds B are introduced to the melt in the specific phase of the process and may be lowered deep into the melt and pull out from the melt by the means of a mechanism not shown in the figure. The seeds may be located in various places within the crucible in the growth zone of the crystal on the seed. Depending on the method by which the process is conducted (e.g. convection-type or diffusion-type process), this zone may be situated in different parts of crucible A.

Bulk mono-crystalline gallium nitride according to the invention is characterized by very low surface dislocation density. It may contain alkaline metals in the amount approx. 0.1 ppm or more—even above 1.0 ppm, and even over 10 ppm of alkaline metals, introduced to the system as flux or mineralizer (depending on the process type of the controlled crystal growth in a selected direction). GDMS (Glow-Discharge Mass Spectroscopy) profiles for the product sample according to the invention show the presence of alkaline metals at the level from 0.1 ppm to a few ppm. Furthermore, certain transitional metals (Fe, Cr, Ni, Co, Ti, Mn) present in the reaction environment, give a measurable signal. For comparison, analogical profiles for a GaN seed crystal obtained by the HVPE method show the presence of potassium at the level below 0.1 ppm. In turn, the profiles of transitional metals are at the level of interference, which proves that the content of those elements in the HVPE seed crystal is very small.

On the basis of conducted research, control and steering conditions have been established for the process of growth of GaN single crystals on seeds from Ga—Li melt in the presence of the above described additional flux and from supercritical ammonia-containing solution. Those conditions were also positively verified for other Group XIII element nitrides as well as for mixed gallium-containing nitrides and other Group XIII elements. Due to the similar parameters of crystalline lattices for gallium, aluminium and indium nitrides, it is possible to replace parts of gallium by indium and/or aluminium in gallium nitride obtained according to the invention.

However, our invention is generally applicable to any substance and any seeded growth method (wherever the seeds of desired size are not available). In the specification the invention is illustrated by GaN growth (by FLUX methods or by crystallization from supercritical ammonia-containing solution), but this does not limit the scope of the invention in any way.

The present invention is further illustrated in the following examples, serving only as an illustration. The examples, as well as the accompanying figures, are intended to illustrate the invention only and should not be construed as limiting in any way the scope of the present invention, as defined by the claims.

Example 1

Growth of Mono-Crystalline Gallium Nitride by Crystallization from Supercritical Ammonia-Containing Solution The dissolution zone of a 100 cm$^3$ high-pressure autoclave was charged with 7.1 g (about 102 mmol) of 6N metallic gallium as the feedstock. Moreover, 4.4 g (about 190 mmol) of 4N metallic sodium was also introduced into the autoclave.

Figure 2:
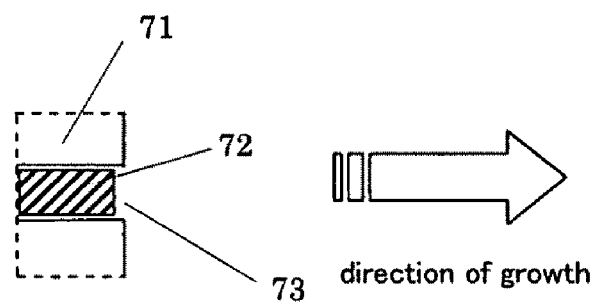
FIG. 2 shows a schematic cross-section of the holder used in Example 1.

Two elementary seeds were placed in the crystallization zone. The elementary seeds had the form of wafers, made of mono-crystalline gallium nitride obtained by HVPE method. The wafers were oriented essentially perpendicular to the c-axis of the crystal. Each wafer was about 44 mm long and 200 µm thick. The wafers, shown schematically in FIG. 1, had fast-growing growing faces and had merging faces at the angle α=45° to the growing faces. The elementary seeds, situated in one plane, were placed in a special holder, providing the angle of 180° between the growing faces of the seeds, while the merging faces of the seeds were touching each other. The cross-section of the holder used is shown schematically in FIG. 2. The construction of the essentially limits the growth of mono-crystalline layers to the merging faces and one of the growing faces at the beginning of the process. This results in merging of elementary seeds by lateral growth. When the crystal grows out of the holder (e.g. by crossing the gap 73 in FIG. 2), its further free growth is possible.

Then the autoclave was filled with 35.7 g of 5N ammonia, tightly closed and put into the set of furnaces.

The dissolution zone was heated (at about 2° C./min) to 450° C., while the crystallization zone was not heated. After about 4 hours from the start of the process (FIG. 3) the target temperature of 450° C. was reached in the dissolution zone and the temperature in the crystallization zone was about 260° C. This temperature distribution was maintained for the next 4 days (FIG. 3). During that time partial transition of gallium to the solution and complete reaction of the remaining gallium to polycrystalline GaN took place Then the temperature in the crystallization zone was increased to 550° C. (at about 3° C./h) and the temperature in the dissolution zone was increased to 475° C. (at about 0.04° C./h), while the pressure of about 380 MPa was obtained within the autoclave. Such temperature distribution evoked convection between the zones of the autoclave, which resulted in a chemical transport of gallium nitride from the dissolution zone (upper) to the crystallization zone (lower), where the gallium nitride was deposited on the seeds. This temperature distribution (i.e. 475° C. in the dissolution zone and 550° C. in the crystallization zone) was maintained for the next 16 days (FIG. 3). Then, in order to increase supersaturation and consequently—increase the growth rate of GaN—the temperature difference between the zones was increased by decreasing the temperature in the dissolution zone to 450° C. (at 0.36° C./h—FIG. 3), which also resulted in decreasing of the pressure in the system to about 370 MPa. This temperature distribution (i.e. 450° C. in the dissolution zone and 550° C. in the crystallization zone) was maintained to the end of the process, i.e. for the next 24 days (FIG. 3).

As the result of the process partial dissolution of the feedstock (i.e. polycrystalline GaN) took place in the dissolution zone. In the crystallization zone merging of the elementary seeds and crystallization of mono-crystalline gallium nitride on the thus-obtained compound seed 77 were observed. The crystallized gallium nitride had the form of lateral growth and then of free growth 82, shown schematically in FIG. 4 (general view) and FIG. 5 (cross-section along the A-A line in FIG. 4). Defects resulting from the merging of elementary seeds were observed in the obtained crystal 82. The defects were gathered in the vicinity of the dotted line 83 in FIG. 4. The thus-obtained crystal 82, having the dimensions of about 84 mm×4 mm×2500 μm, was separated with a wire saw from the (merged) elementary seeds. After separation the crystal was used as a seed for free growth in next processes. The (merged) elementary seeds 77, constituting a GaN single crystal of about 88 mm×3 mm×200 μm, were also used as seed (for lateral growth) in next processes.

The half width of the X-ray rocking curve (FWHM) from (0002) plane (for the Cu K α1 line) of the obtained crystal was equal to 22 arcsec, while the radius of curvature of its crystalline lattice was equal to 12 m. Microscopic investigations of the C-face of the crystal showed that the surface dislocation density (measured by Etch Pit Density—EPD method) for this face was about $2\times10^2/cm^2$, while the HVPE elementary seeds used in this process were characterized by EPD of the order of $10^6/cm^2$. As far as the electrical properties are concerned, the obtained crystal had n-type electrical conductivity and its resistivity was about 0.04 Ω·cm.

Example 2

The same procedures were followed as in Example 1, with the only exception that the elementary seeds were drawn aside from each other, parallel to their merging faces, in the way shown in FIG. 6a. The obtained crystal had the values of FWHM, EPD, radius of curvature, as well as electrical properties similar to those given in Example 1. Similarly as in Example 1, both the obtained crystal and the merged elementary seeds were preserved to be used as seeds for free or lateral growth in next processes.

Example 3

The same procedures were followed as in Example 1, with the only exception that the elementary seeds were drawn aside from each other parallel to their merging faces, in the way shown in FIG. 6b. The obtained crystal had the values of FWHM, EPD, radius of curvature, as well as electrical properties similar to those given in Example 1. Similarly as in Example 1, both the obtained crystal and the merged elementary seeds were preserved to be used as seeds for free or lateral growth in next processes.

Examples 4, 5 and 6

The same procedures were followed as in Examples 1, 2 and 3, with the only exception that the elementary seeds used had fast-growing growing faces and had merging faces at the angle α=60° to the growing faces (FIG. 1). The seeds might be drawn aside from each other parallel to their merging faces, in the way shown in FIG. 6a or 6b. The obtained crystals had the values of FWHM, EPD, radius of curvature, as well as electrical properties similar to those given in Examples 1-3. Similarly as in the previous examples, the obtained crystals and the merged elementary seeds were preserved to be used as seeds for free or lateral growth in next processes.

Examples 7, 8 and 9

The same procedures were followed as in Examples 1, 2 and 3, with the only exception that one of the elementary seeds used had fast-growing growing faces and had merging faces at the angle α=60° to the growing faces (FIG. 1), while the other elementary seed used had fast-growing growing faces and had merging faces at the angle α=45° to the growing faces (FIG. 1). The seeds might be drawn aside from each other parallel to their merging faces, in the way shown in FIG. 6a or 6b. The obtained crystals had the values of FWHM, EPD, radius of curvature, as well as electrical properties similar to those given in Examples 1-3. Similarly as in the previous examples, the obtained crystals and the merged elementary seeds were preserved to be used as seeds for free or lateral growth in next processes.

Examples 10-18

The same procedures were followed as in Examples 1-9, with the only exception that the elementary seeds used were placed in another type of holder. The cross-section of this holder is shown schematically in FIG. 7. The obtained crystals had the values of FWHM, EPD, radius of curvature, as well as electrical properties similar to those given in Examples 1-9. Similarly as in the previous examples, the obtained crystals and the merged elementary seeds were preserved to be used as seeds for free or lateral growth in next processes.

Example 19

The same procedures were followed as in Example 1, with the only exception that the elementary seeds had the form of wafers, made of mono-crystalline gallium nitride obtained by HVPE method. The wafers were oriented essentially perpendicular to the c-axis of the crystal. Each wafer was about 20 mm long and 200 µm thick. The wafers, shown schematically in FIG. 1, had slow-growing growing faces and had merging faces at the angle α=30° to the growing faces (FIG. 8). The elementary seeds, situated in one plane, were placed in a special holder, providing the angle of 120° between the growing faces of the seeds, while the merging faces of the seeds were touching each other.

As the result of the process merging of the elementary seeds and crystallization of mono-crystalline gallium nitride on the thus-obtained compound seed were observed. The crystallized gallium nitride had the form of lateral growth 82 shown schematically in FIG. 9. Defects resulting from the merging of elementary seeds were observed in the obtained crystal 82. The defects were gathered in the vicinity of the dotted line 83 in FIG. 9. The thus-obtained crystal 82, having the dimensions of about 35 mm×10 mm×2000 µm, was separated with a wire saw from the (merged) elementary seeds 77. After separation the crystal was used as a seed for free growth in next processes. The obtained crystal had the values of FWHM, EPD, radius of curvature, as well as electrical properties similar to those given in Example 1.

Example 20

Free Continuation of Growth (by Crystallization from Supercritical Ammonia-Containing Solution) of the GaN Crystals Obtained in Processes Described in Examples 1-18

According to the disclosure of WO 02/101120, dissolution zone of a 1350 cm³ high-pressure autoclave was charged with gallium-containing feedstock, seeds, mineralizer and ammonia.

Crystals selected from those obtained in processes described in Examples 1-18 were used as seeds. Selected crystals (seeds) were placed in the crystallization zone of the autoclave in a way enabling free growth on the seeds.

Metallic sodium was used as the mineralizer. The feedstock was placed in the dissolution zone, while the seeds were mounted in the crystallization zone. The crystallization process on the seeds was carried out under constant temperature conditions of $T_2=550°$ C. in the crystallization zone and $T_1=450°$ C. in the dissolution zone. This temperature distribution inside the autoclave was maintained for 76 days (FIG. 10). At such conditions the pressure within the autoclave was ca. 410 MPa.

As the result of the process partial dissolution of the feedstock (i.e. polycrystalline GaN) took place in the dissolution zone. In the crystallization zone further growth of mono-crystalline gallium nitride on the compound seeds was observed. The obtained crystals are shown schematically in FIG. 11. They were about 6 mm thick and had the shape of prisms with the base show in FIG. 11. the longest diagonal of the base was about 85 mm long, while the width of the base (measured in the direction perpendicular to the longest diagonal) was about 30 mm. Defects resulting from the merging of elementary seeds were observed in the obtained crystal. The defects were gathered in the vicinity of the dotted line 83 in FIG. 11. Two circular wafer-like crystals (indicated with a dashed line in FIG. 11) were cut out of each of the crystals. The wafers did not contain the surface of join and were free of the defects gathered in its vicinity. The half width of the X-ray rocking curve (FWHM) from (0002) plane (for the Cu K α1 line) of the thus-obtained 1-inch crystals was equal to 20 arcsec, while the radius of curvature of its crystalline lattice was equal to 38 m. Microscopic investigations of the C-face of the crystals showed that the surface dislocation density (measured by Etch Pit Density—EPD method) for this face was about $2\times10^2/cm^2$. As far as the electrical properties are concerned, they were similar to those given in Example 1. The thus-obtained crystals were sliced into wafers. Some of the wafers were then used as seeds in next processes. Circular 1-inch substrates for epitaxy were produced out of the remaining wafers, as the result of a typical processing, including mechanical and chemical-mechanical polishing (CMP).

Example 21

The same procedures were followed as in Example 20. Crystals selected from those obtained in processes described in Examples 1-18 were used as seeds. The seeds were placed in the crystallization zone of the autoclave, in such a way that initially the growth of crystalline layers was possible only on the N-side of the seeds. Once the thus-grown crystal was large enough, its further—free—growth was possible later in the process. The obtained crystal had the size, values of FWHM, EPD, radius of curvature, as well as electrical properties similar to those given in Example 20. As in Example 20, circular wafer-like crystals, which did not include the surface of join, were cut out of the crystal. Next, substrates for epitaxy and seeds for next processes were manufactured out of the wafers.

Example 22

Doping

The same procedures were followed as in Example 20, with the only exception that 0.05 g of metallic zinc or 0.02 g of metallic magnesium was added to the feedstock. Such amount of zinc or magnesium did not essentially influence the growth rate of GaN crystals. The obtained crystals had the size, values of FWHM, EPD and radius of curvature similar to those given in Example 20. As far as the electrical properties are concerned, the obtained material was compensated (semi-insulating), having the electrical resistivity of about $10^6$ Ω·cm. As in Example 20, circular wafer-like crystals, which did not include the surface of join, were cut out of the crystal. Next, substrates for epitaxy were manufactured out of the wafers.

Example 23

Doping

The same procedures were followed as in Example 20, with the only exception that 0.10 g of metallic zinc or 0.04 g of metallic magnesium was added to the feedstock. Such amount of zinc or magnesium did not essentially influence the growth rate of GaN crystals. The obtained crystals had the size, values of FWHM, EPD and radius of curvature similar to those given in Example 20. As far as the electrical properties are concerned, the obtained material revealed p-type electrical conductivity and had the resistivity of about $1.5 \cdot 10^{-3}$ Ω·cm. As in Example 20, circular wafer-like crystals, which did not include the surface of join, were cut out of the crystal. Next, substrates for epitaxy were manufactured out of the wafers.

Example 24

Doping

The same procedures were followed as in Example 20, with the only exception that 0.02 g of silicon was added to the feedstock. Such amount of silicon did not essentially influence the growth rate of GaN crystals. The obtained crystals had the size, values of FWHM, EPD and radius of curvature similar to those given in Example 20. As far as the electrical properties are concerned, the obtained material revealed n-type electrical conductivity and had the resistivity of about $1.2 \cdot 10^{-3}$ Ω·cm. As in Example 20, circular wafer-like crystals, which did not include the surface of join, were cut out of the crystal. Next, substrates for epitaxy were manufactured out of the wafers.

Example 25

The same procedures were followed as in Example 1, with the only exception that three elementary seeds, in the form of wafers, made of mono-crystalline gallium nitride obtained by HVPE method, were used. The wafers were oriented essentially perpendicular to the c-axis of the crystal. Each wafer was about 200 μm thick. The wafers at sides had the length of about 25 mm, while the central wafer was about 50 mm long. The wafers had fast-growing growing faces and had merging faces at the angle α=45° or—in another embodiment—α=60° to the growing faces. As in Example 1, the elementary seeds, situated in one plane, were placed in a special holder, providing the angle of 180° between the growing faces of the seeds, while the merging faces of the seeds were touching each other. The construction of the essentially limits the growth of mono-crystalline layers to the merging faces and one of the growing faces at the beginning of the process. This results in merging of elementary seeds by lateral growth. In course of the process, further free growth on the thus-obtained compound seed is possible.

As the result of the process merging of the elementary seeds and crystallization of mono-crystalline gallium nitride on the thus-obtained compound seed 77 were observed. The crystallized gallium nitride had the form of lateral growth and then free growth 82, shown schematically in FIG. 12. Defects resulting from the merging of elementary seeds were observed in the obtained crystal 82. The defects were gathered in the vicinity of the dotted lines 83 in FIG. 12. The thus-obtained crystal 82, having the dimensions of about 96 mm×3 mm×2300 μm, was separated with a wire saw from the (merged) elementary seeds. After separation the crystal was used as a seed for free growth in next processes. The (merged) elementary seeds 77, constituting a GaN single crystal of about 100 mm×3 mm×200 μm, were also used as seed (for lateral growth) in next processes.

The half width of the X-ray rocking curve (FWHM) from (0002) plane (for the Cu K α1 line) of the obtained crystal was equal to 25 arcsec, while the radius of curvature of its crystalline lattice was equal to 20 m. Microscopic investigations of the C-face of the crystal showed that the surface dislocation density (measured by Etch Pit Density—EPD method) for this face was about $1 \times 10^2/cm^2$. Electrical properties of the crystal were similar to those given in Example 1.

Example 26

Free Continuation of Growth on a Crystal Obtained in the Previous Example

The same procedures were followed as in Example 20, with the only exception that the total duration of the process was about 140 days, and the crystal obtained in the process described in Example 25 was used as the seed. The seed was placed in the crystallization zone of the autoclave in such a way that free growth on the seed was enabled.

As the result of the process further growth of mono-crystalline gallium nitride on the compound seeds was observed. The obtained crystal is shown schematically in FIG. 13. They were about 9 mm thick and had the shape of prisms with the rhombus base. The longer diagonal of the base was about 97 mm long, while the shorter diagonal of the base was about 58 mm long. Defects resulting from the merging of elementary seeds were observed in the obtained crystal. The defects were gathered in the vicinity of the dotted lines 83 in FIG. 13. One circular wafer-like crystal (indicated with a dashed line in FIG. 13) was cut out of the crystal. The wafer did not contain the surface of join and was free of the defects gathered in its vicinity. The half width of the X-ray rocking curve (FWHM) from (0002) plane (for the Cu K α1 line) of the thus-obtained 2-inch crystal was equal to 17 arcsec, while the radius of curvature of its crystalline lattice was equal to 62 m. Microscopic investigations of the C-face of the crystal showed that the surface dislocation density (measured by Etch Pit Density—EPD method) for this face was about $3 \times 10^2/cm^2$. As far as the electrical properties are concerned, they were similar to those given in Example 1. The thus-obtained crystal was sliced into wafers. Some of the wafers were then used as seeds in next processes. circular 2-inch substrates for epitaxy were produced out of the remaining wafers, as the result of a typical processing, including mechanical and chemical-mechanical polishing (CMP).

Example 27

Merging with "Overlap" in an Azide Process

The dissolution zone of a 84 cm³ high-pressure autoclave was charged with 6.4 g (about 76 mmol) of 6N polycrystalline gallium nitride. Moreover, 9.8 g (about 150 mmol) of 5N sodium azide was also introduced into the autoclave.

Two elementary seeds were placed in the crystallization zone. The elementary seeds had the form of wafers, made of mono-crystalline gallium nitride obtained by HVPE method. The wafers were oriented essentially perpendicular to the c-axis of the crystal. Each wafer was about 40 mm long and 200 μm thick. The wafers had fast-growing growing faces. The elementary seeds were placed in a holder having the construction similar to that mentioned in Example 1. The elementary seeds were situated in one plane, partially overlapping, and the angle of 180° between the growing faces of the seeds was provided (the configuration of the seeds is shown schematically in FIG. 14).

Then the autoclave was filled with 39 g of 5N ammonia and tightly closed. After putting into the set of furnaces, the autoclave was heated to 300° C. (at about 2° C./min). After two days, during which the azide was decomposed and the solvent having ammonobasic character was produced, which enabled partial transition of polycrystalline gallium nitride to the solution, the temperature in the dissolution zone was increased to 400° C. (at about 2° C./min) and the temperature in the crystallization zone was increased to 500° C. (at about 2° C./min, too). This temperature distribution was maintained for the next 32 days (FIG. 15). The expected pressure inside the autoclave is about 230 MPa. The actual pressure was about 330 MPa, and this growth was caused by gaseous nitride which released as a result of decomposition of azide.

As the result of the process partial dissolution of the feedstock (i.e. polycrystalline GaN) took place in the dissolution zone. In the crystallization zone merging of the elementary seeds and crystallization of mono-crystalline gallium nitride on the thus-obtained compound seed were observed. The crystallized gallium nitride had the form of lateral growth and then of free growth, and was very similar to that described in Example 1, shown schematically in FIG. 4. Defects resulting from the merging of elementary seeds were observed in the obtained crystal. The defects were gathered along a wide line, corresponding to the overlap of the elementary seeds. The thus obtained crystal, having the dimensions of about 76 mm×3 mm×1800 µm, was separated with a wire saw from the (merged) elementary seeds. After separation the crystal was used as a seed for free growth in next processes. The (merged) elementary seeds, constituting a GaN single crystal of about 80 mm×3 mm×200 µm, were also used as seed (for lateral growth) in next processes.

Structural parameters of the thus-obtained crystal were slightly worse than those of the crystal described in Example 1. The half width of the X-ray rocking curve (FWHM) from (0002) plane (for the Cu K α1 line) of the obtained crystal was equal to 34 arcsec, while the radius of curvature of its crystalline lattice was equal to 10 m. Microscopic investigations of the C-face of the crystal showed that the surface dislocation density (measured by Etch Pit Density—EPD method) for this face was about $1\times10^3/cm^2$, while the HVPE elementary seeds used in this process were characterized by EPD of the order of $10^6/cm^2$. As far as the electrical properties are concerned, they were similar to those given in Example 1.

Example 28

Merging in Configuration of Example 1, Using a Convective Flux Process

A mixture of metallic gallium and lithium, in which the molar ratio of Ga:Li was equal to 1:2, was placed in a high-temperature reactor (FIG. 16) in a molybdenum crucible (A), having the volume of 250 $cm^3$. In addition, GaN-containing feedstock (C) was put at the bottom of the crucible. Additional flux selected from a group consisting of In, K, Na, Pb, Rb, Sb, Sn and Te was also added to the system, in such an amount that the molar ratio of X:Ga:Li was equal to 0.8:1.0:2.0. In addition, GaN-containing feedstock (C) was put at the bottom of the crucible. The mixture was heated in the argon (Ar) atmosphere to $T_1=760°$ C. in the upper part of the crucible (FIG. 4) and to $T_2=840°$ C. in the lower part of the crucible (straight and dashed line in FIG. 17, respectively). As the result—an alloy of the aforementioned metals of the given molar ratio of X:Ga:Li was obtained. Such temperature distribution in the system was maintained for ca. 24 hours. The atmosphere was then changed to nitrogen ($N_2$) under the pressure of 2.3 MPa. Such temperature and pressure conditions in the reactor were then maintained for the next 3 days.

Then gallium nitride elementary seeds (B) were immersed in the melted alloy in the cold (upper) part of the crucible. The seeds had the form and configuration identical to that described in Example 1 with the sole exception that shorter wafers were used (each wafer was about 20 mm long). The wafers were placed in a holder constructed identically to that described in Example 1.

The growth of mono-crystalline gallium nitride on the seeds was led at the process conditions for the next 32 days. The reactor was then cooled down at 0.1° C./min to 650° C. and further down to the room temperature (RT) at 1° C./min. Alternatively, the seeds were slowly pulled out of the melted alloy at the process conditions.

As the result of the process, merging of elementary seeds and crystallization of gallium nitride on the thus-obtained compound seed, in the form of lateral growth and then free growth were observed. The obtained crystal was very similar to the one obtained in Example 1, show schematically in FIG. 4. As in the previous example, defects resulting from the merging of elementary seeds were observed in the obtained crystal. The defects were gathered in the vicinity of the surface of join (dotted line in FIG. 4).

The obtained crystal had dimensions of about 36 mm×2 mm×1200 µm, and its crystalline parameters were better than the crystalline parameters of HVPE elementary seeds used in the process.

Example 29

Example of a Flat (Two Dimensional) Configuration of Elementary Seeds

The same procedures were followed as in Example 20, with the only exception that the object of the process described in this example was merging of elementary seeds instead of continuation of growth of previously obtained crystals.

Six elementary seeds were placed in the crystallization zone. The elementary seeds had the form of wafers, made of mono-crystalline gallium nitride obtained by HVPE method. The wafers were oriented essentially perpendicular to the c-axis of the crystal. Each wafer was about 20 mm long and 200 µm thick. The wafers had fast-growing growing faces (long) and had merging faces (short) at the angle α=60° to the growing faces. The elementary seeds were placed in a special holder, along the sides of a regular hexagon (the configuration of elementary seeds in this example is schematically illustrated in FIG. 18).

As the result of the process, merging of elementary seeds and crystallization of gallium nitride on the thus-obtained compound seed in the form of lateral growth were observed. The thus-obtained single crystal of gallium nitride had the form of a regular hexagon, having the side length of about 20 mm. As in previous examples, defects resulting from the merging of elementary seeds were observed in the obtained crystal. In this case, the defects were gathered along the longer diagonals of the hexagon.

The longer diagonals of the obtained hexagonal crystal had the length of about 40 mm. The crystal was about 5 mm thick and its crystalline parameters were better than the crystalline parameters of HVPE elementary seeds used in the process.

Example 30

Example of a Spatial (Three Dimensional) Configuration of Elementary Seeds

The same procedures were followed as in Example 20, with the only exception that the object of the process described in this example was merging of elementary seeds instead of continuation of growth of previously obtained crystals.

Four elementary seeds were placed in the crystallization zone. The elementary seeds had the form of a cuboid, made of mono-crystalline gallium nitride obtained by re-crystallization from supercritical ammonia-containing solution. Each elementary seed had approximate dimensions of 2 mm×2 mm×20 mm. The seeds had fast-growing growing faces (long) as well as long and short merging faces. The elementary seeds were placed in a special holder, in the configuration presented schematically in FIG. 19a. This is a spatial (3D) configuration.

As the result of the process, merging of elementary seeds and crystallization of gallium nitride on the thus-obtained compound seed in the form of lateral growth and free growth in the directions x, y and z (indicated in FIG. 19) were observed. The thus-obtained single crystal of gallium nitride had the form close to a cuboid, having the dimensions of about 10 mm×6 mm×42 mm. Its crystalline parameters were similar to crystalline parameters of the elementary seeds used in this process.

Example 31

Another Example of a Spatial (Three Dimensional) Configuration of Elementary Seeds The same procedures were followed as in Example 20, with the only exception that the object of the process described in this example was merging of elementary seeds instead of continuation of growth of previously obtained crystals.

Two elementary seeds were placed in the crystallization zone. The elementary seeds had the form close to a cuboid, made of mono-crystalline gallium nitride obtained by re-crystallization from supercritical ammonia-containing solution. Each elementary seed had approximate dimensions of 2 mm×2 mm×20 mm. The seeds had fast-growing growing faces (long) as well as short merging faces. The elementary seeds were mounted on a plate in the configuration presented schematically in FIG. 19b. This is a spatial (3D) configuration. The merging faces of the seeds in FIG. 19b are dotted. Moreover, the merging faces are tilted at $\alpha=45°$ (in one process) or at $\alpha=60°$ with respect to fast-growing faces (see FIG. 19b). Growth on the seeds is possible in all directions but the (−x) direction (see FIG. 19b). Growth in the (−x) direction is blocked by the plate, on which the seeds are mounted. Merging of elementary seeds is possible.

As the result of the process, merging of elementary seeds and crystallization of gallium nitride on the thus-obtained compound seed in the form of lateral growth and free growth in all directions but (−x) were observed. The thus-obtained single crystal of gallium nitride had the form close to a cuboid, having the dimensions of about 4 mm×6 mm×42 mm. Its crystalline parameters were similar to crystalline parameters of the elementary seeds used in this process.

Example 32

Semiconductor UV Laser Formed on a Substrate According to the Invention

In the enclosed drawing FIG. 20 shows a sectional view of a ridge type UV laser diode having an active layer of $Al_xGa_{1-x}N$ ($0 \leq x < 0.7$) multi-quantum well (MQW) structure, which is formed on the substrate according to the present invention.

First, a high-quality gallium nitride bulk single crystal was obtained by crystallization from supercritical ammonia-containing solution, as described in previous examples. Out of this crystal, a polar substrate 101, having the form of a wafer of the diameter of ca. 5 cm, made of mono-crystalline gallium nitride and having the surface essentially perpendicular to the c axis of the crystal was manufactured. The Ga-terminated side of the substrate 101 had the surface dislocation density of about $2 \times 10^2/cm^2$.

As shown in FIG. 20, on the substrate 101 there are formed in turn by MOCVD method, an n-type contact layer 103 of 5 µm $Al_{0.05}Ga_{0.95}N$ doped with Si, a crack-preventing layer 104 of 0.15 µm $In_{0.06}Ga_{0.94}N$ doped with Si, formed at 800° C., an n-type clad layer 105 of super lattice comprising 100 layers of 2.5 nm (25 Å) $Al_{0.05}Ga_{0.95}N$ doped with Si at $5 \times 10^{18}/cm^3$ and 100 layers of 2.5 nm un-doped $Al_{0.1}Ga_{0.9}N$ and an n-type optical guide layer 106 of 0.15 µm un-doped $Al_{0.15}Ga_{0.85}N$. Any other layers except the n-type clad layer 105 may be omitted depending on the device characteristics.

On the n-type nitride semiconductor layers 103 to 106, there is formed an active layer 107, which comprises multi-quantum well structure made by combination of 4.5 nm un-doped GaN well-layer and 10 nm $Al_{0.15}Ga_{0.85}N$ barrier layer, wherein the well layer may be un-doped while the barrier layer may be doped with donor (n-type) dopants such as Si at $10^{17}$ to $10^{19}/cm^3$. In the preferred case, the most upside barrier layer may be un-doped to prevent Mg-diffusion from the next layer, namely the p-type carrier confining layer 108, which contains acceptor (p-type) dopants such as Mg.

On the last barrier layer, there is formed p-type nitride semiconductor comprising a p-type electron confining layer 108 of 10 nm p-type $Al_{0.3}Ga_{0.7}N$ doped with Mg at $1 \times 10^{19}/cm^3$, a p-type optical guide layer 109 of 0.15 µm $Al_{0.04}Ga_{0.96}N$ doped with Mg, a p-type super lattice clad layer 110 having the total thickness of 0.45 µm, composed of 90 layers of 2.5 nm p-type $Al_{0.1}Ga_{0.9}N$ and 2.5 nm $Al_{0.05}Ga_{0.95}N$ (wherein at least one kind of layers forming the super lattice is doped with Mg) and a p-type contact layer 111 of 15 nm GaN doped with Mg at $10^{21}/cm^3$. Any other layers except the p-type clad layer 110 may be omitted depending on the device characteristics.

The laser diode is provided with a ridge strip made by etching in a manner that both side etched optical guide layer 109 is up to 0.1 µm in thickness. The described device is also provided with a strip-like p-electrode 120 of Ni/Au, a strip-like n-electrode 121 of Ti/Al, a protective layer 162 of $ZrO_2$, a dielectric multi-layer 164 of $SiO_2$ and $TiO_2$, and pad electrodes 122 and 123 of Ni—Ti—Au.

The invention claimed is:

1. A process for obtaining a larger area substrate of mono-crystalline gallium-containing nitride by making selective crystallization of gallium containing nitride on a smaller elementary seed under a crystallization temperature and/or pressure from a supercritical ammonia-containing solution made by dissolution of gallium-containing feedstock in a supercritical ammonia-containing solvent with alkali metal ions, comprising:

providing two or more elementary seeds, placing the elementary seeds in at least one holder for ensuring a precise arrangement of the elementary seeds with respect to each other; and making selective crystallization on the two or more separate elementary seeds to get a merged larger compound seed.

2. The process according to claim 1, wherein the step of providing two or more elementary seeds includes using the elementary seeds having fast-growing growing faces and merging faces significantly tilted off the slow-growing crystalline plane.

3. The process according to claim 1, wherein said step of making selective crystallization on the two or more separate elementary seeds includes limiting a process straight growth at an initial stage and evoking merging by lateral growth.

4. The process according to claim 1, wherein said step of providing two or more elementary seeds includes forming a compound seed, and carrying out lateral growth on the compound seed.

5. The process according to claim 1, wherein said step of providing two or more elementary seeds includes forming a compound seed, and carrying out straight growth on the compound seed.

6. The process according to claim 1, wherein said step of providing two or more elementary seeds includes forming a compound seed, and carrying out free growth on the compound seed.

7. The process according to claim 1, wherein said step of placing the elementary seeds in at least one holder includes ensuring an adjacent orientation of their merging faces with respect to each other.

8. The process according to claim 1, wherein said step of placing the elementary seeds in at least one holder includes covering and/or exposing selected faces of the seed, so that crystalline growth on these faces is essentially disabled/enabled.

9. The process according to claim 1, wherein said step of making selective crystallization on the two or more separate elementary seeds to get a merged larger compound seed includes obtaining gallium-containing nitride single crystals.

10. The process according to claim 9, wherein said step of making selective crystallization on the two or more separate elementary seeds to get a merged larger compound seed includes obtaining the single crystals grown by crystallization from the supercritical ammonia-containing solution.

11. The process according to the claim 9, wherein said step of making selective crystallization on the two or more separate elementary seeds to get a merged larger compound seed includes obtaining the single crystals grown by crystallization from melt.

12. The process according to the claim 9, wherein said step of making selective crystallization on the two or more separate elementary seeds to get a merged larger compound seed includes growing elementary seeds in the direction parallel to the c crystalline axis.

13. The process according to the claim 9, wherein said step of making selective crystallization on the two or more separate elementary seeds to get a merged larger compound seed includes growing the elementary seeds in a direction perpendicular to the c crystalline axis and using fast-growing growing faces.

14. The process according to the claim 12, wherein said step of providing two or more elementary seeds includes using polyhedrons with appropriately formed growing and/or merging faces.

15. The process according to the claim 14, wherein said step of providing two or more elementary seeds includes placing the two or more the elementary seeds so as to form a flat plate in one plane.

16. The process according to the claim 14, wherein said step of providing two or more elementary seeds includes polishing the growing and/or merging faces of the elementary seeds.

17. A process for obtaining a larger area substrate of monocrystalline gallium-containing nitride by making selective crystallization of gallium containing nitride on a smaller elementary seed under a crystallization temperature and/or pressure from a supercritical ammonia-containing solution made by dissolution of gallium-containing feedstock in a supercritical ammonia-containing solvent with alkali metal ions, comprising:

providing two or more elementary seeds, placing the elementary seeds in at least one holder for ensuring a precise arrangement of the elementary seeds with respect to each other; and making selective crystallization on the two or more separate elementary seeds to get a merged larger compound seed, wherein said step of placing the elementary seeds in at least one holder includes using the holder having at least two side walls to cover the elementary seeds.

18. The process according to claim 17, wherein said step of placing the elementary seeds in at least one holder includes using the holder having a shape which contacts opposite sides of the elementary seeds.

19. The process according to claim 17, wherein said step of placing the elementary seeds in at least one holder includes using the holder having a gap to grow the elementary seeds.

20. The process according to claim 1, wherein said step of placing the elementary seeds in at least one holder includes using the holder having at least three side walls to cover the elementary seeds.

21. A process for obtaining a larger area substrate of monocrystalline gallium-containing nitride by making selective crystallization of gallium containing nitride, comprising the steps of:

providing at least two elementary seeds in a high pressure autoclave, and making selective crystallization on the at least two elementary seeds to get a merged larger compound seed, the selective crystallization being done under a crystallization temperature and/or pressure from a supercritical ammonia-containing solution made by dissolution of gallium-containing feedstock in a supercritical ammonia-containing solvent with alkali metal ions.

22. The process according to claim 21, wherein the step of providing two or more elementary seeds includes using the elementary seeds having fast-growing growing faces and merging faces significantly tilted off the slow-growing crystalline plane.

23. The process according to claim 21, wherein said step of making selective crystallization on the two or more separate elementary seeds includes limiting a process straight growth at an initial stage and evoking merging by lateral growth.

24. The process according to claim 21, wherein said step of providing two or more elementary seeds includes forming a compound seed, and carrying out lateral growth on the compound seed.

25. The process according to claim 1, wherein said step of providing two or more elementary seeds includes forming a compound seed, and carrying out straight growth on the compound seed.

26. The process according to claim 21, wherein said step of providing two or more elementary seeds includes forming a compound seed, and carrying out free growth on the compound seed.

27. The process according to claim 21, wherein said step of placing the elementary seeds in at least one holder includes ensuring an adjacent orientation of their merging faces with respect to each other.

28. The process according to claim 21, wherein said step of placing the elementary seeds in at least one holder includes covering and/or exposing selected faces of the seed, so that crystalline growth on these faces is essentially disabled/enabled.

29. The process according to claim 21, wherein said step of making selective crystallization on the two or more separate elementary seeds to get a merged larger compound seed includes obtaining gallium-containing nitride single crystals.

30. The process according to claim 29, wherein said step of making selective crystallization on the two or more separate elementary seeds to get a merged larger compound seed includes obtaining the single crystals grown by crystallization from the supercritical ammonia-containing solution.

31. The process according to the claim 29, wherein said step of making selective crystallization on the two or more separate elementary seeds to get a merged larger compound seed includes obtaining the single crystals grown by crystallization from melt.

32. The process according to the claim 29, wherein said step of making selective crystallization on the two or more separate elementary seeds to get a merged larger compound seed includes growing elementary seeds in the direction parallel to the c crystalline axis.

33. The process according to the claim 29, wherein said step of making selective crystallization on the two or more separate elementary seeds to get a merged larger compound seed includes growing the elementary seeds in a direction perpendicular to the c crystalline axis and using fast-growing growing faces.

34. The process according to the claim 33, wherein said step of providing two or more elementary seeds includes using polyhedrons with appropriately formed growing and/or merging faces.

35. The process according to the claim 34, wherein said step of providing two or more elementary seeds includes placing the two or more the elementary seeds so as to form a flat plate in one plane.

36. The process according to the claim 34, wherein said step of providing two or more elementary seeds includes polishing the growing and/or merging faces of the elementary seeds.

37. The process according to claim 21, wherein said step of placing the elementary seeds in at least one holder includes using the holder having at least two side walls to cover the elementary seeds.

38. The process according to claim 37, wherein said step of placing the elementary seeds in at least one holder includes using the holder having a shape which contacts opposite sides of the elementary seeds.

39. The process according to claim 37, wherein said step of placing the elementary seeds in at least one holder includes using the holder having a gap to grow the elementary seeds.

40. The process according to claim 21, wherein said step of placing the elementary seeds in at least one holder includes using the holder having at least three side walls to cover the elementary seeds.

\* \* \* \* \*